(12) United States Patent
Suzuki

(10) Patent No.: US 8,552,552 B2
(45) Date of Patent: Oct. 8, 2013

(54) SEMICONDUCTOR DEVICE AND A METHOD OF MANUFACTURING THE SAME

(75) Inventor: Shinya Suzuki, Nanae (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 32 days.

(21) Appl. No.: 12/239,810

(22) Filed: Sep. 28, 2008

(65) Prior Publication Data

US 2009/0121349 A1 May 14, 2009

(30) Foreign Application Priority Data

Nov. 9, 2007 (JP) .................................. 2007-292079

(51) Int. Cl.
*H01L 23/485* (2006.01)
*H01L 23/528* (2006.01)

(52) U.S. Cl.
USPC .......................................... 257/737; 257/773

(58) Field of Classification Search
USPC ......................................................... 257/737
See application file for complete search history.

(56) References Cited

U.S. PATENT DOCUMENTS

| | | | |
|---|---|---|---|
| 6,049,132 A | 4/2000 | Iwahashi et al. | |
| 6,261,883 B1* | 7/2001 | Koubuchi et al. | ............. 438/197 |
| 6,538,326 B2 | 3/2003 | Shimizu et al. | |
| 7,728,442 B2 | 6/2010 | Yoshioka et al. | |
| 2005/0121803 A1* | 6/2005 | Angell et al. | ................. 257/779 |
| 2006/0154469 A1* | 7/2006 | Hess et al. | ..................... 438/618 |
| 2006/0289998 A1* | 12/2006 | Kanaoka et al. | .............. 257/758 |
| 2007/0080416 A1* | 4/2007 | Yoshioka et al. | ............. 257/433 |
| 2007/0246752 A1* | 10/2007 | Cheng et al. | .................. 257/288 |

FOREIGN PATENT DOCUMENTS

| | | |
|---|---|---|
| CN | 1945817 A | 4/2007 |
| JP | 9-205146 A | 8/1997 |
| JP | 10-92811 | 4/1998 |
| JP | 2002-198374 A | 7/2002 |
| JP | 2007-103848 A | 4/2007 |
| JP | 2007-123407 A | 5/2007 |

OTHER PUBLICATIONS

Office Action issued Aug. 28, 2012 in Japanese Patent Application No. 2007-292079.

* cited by examiner

*Primary Examiner* — Ha Tran T Nguyen
*Assistant Examiner* — Raj R Gupta
(74) *Attorney, Agent, or Firm* — Miles & Stockbridge P.C.

(57) ABSTRACT

A technique which improves the reliability in coupling between a bump electrode of a semiconductor chip and wiring of a mounting substrate, more particularly a technique which guarantees the flatness of a bump electrode even when wiring lies in a top wiring layer under the bump electrode, thereby improving the reliability in coupling between the bump electrode and the wiring formed on a glass substrate. Wiring, comprised of a power line or signal line, and a dummy pattern are formed in a top wiring layer beneath a non-overlap region of a bump electrode. The dummy pattern is located to fill the space between wirings to reduce irregularities caused by the wirings and space in the top wiring layer. A surface protection film formed to cover the top wiring layer is flattened by CMP.

15 Claims, 23 Drawing Sheets

SEMICONDUCTOR DEVICE AND A METHOD OF MANUFACTURING THE SAME

CROSS-REFERENCE TO RELATED APPLICATIONS

The disclosure of Japanese Patent Application No. 2007-292079 filed on Nov. 9, 2007 including the specification, drawings and abstract is incorporated herein by reference into its entirety.

BACKGROUND OF THE INVENTION

The present invention relates to a semiconductor device and a method of manufacturing the same and more particularly to a technique useful for a semiconductor device used in an LCD (Liquid Crystal Display) driver.

Japanese Unexamined Patent Publication No. 2007-103848 discloses a technique of reducing the semiconductor chip size. According to this technique, a pad and wirings are formed over an insulation film. A surface protection film is formed over the insulation film including the pad and wirings and an opening is made in the surface protection film. The opening is formed over the pad to expose the pad surface. A bump electrode is formed over the surface protection film including this opening. The pad is much smaller than the bump electrode. Consequently wirings can be disposed beneath the bump electrode, in the same layer as the pad. In other words, in this technique, wirings are disposed in space made available under the bump electrode by reducing the pad size.

SUMMARY OF THE INVENTION

In recent years, LCDs which use liquid crystal display elements have been rapidly spreading. An LCD is controlled by a driver which drives the LCD. The LCD driver is comprised of a semiconductor chip which is, for example, mounted on a glass substrate. The semiconductor chip of the LCD driver has a plurality of transistors and multilayer wiring layer over its semiconductor substrate with bump electrodes over the surface. A bump electrode formed over the surface is coupled with the glass substrate through an anisotropic conductive film. The semiconductor chip and the glass substrate are thus coupled through the bump electrode. For the purpose of increasing the adhesive strength, it has been a common practice to increase the bump electrode area to make the area of adhesion between the semiconductor chip and the glass substrate larger. Therefore, the bump electrode used in a semiconductor chip for an LCD driver is much larger than general-purpose semiconductor chips.

In the LCD driver, an insulation film which functions as a surface protection film (passivation film) is formed under the bump electrode and the bump electrode is coupled with a pad formed in the top layer of the multilayer wiring layer through an opening made in the insulation film. Usually, the opening and pad are almost equal to the bump electrode in terms of area. However, when the pad is almost equal to the bump electrode, the pad occupies a large area and raises a problem that no space is available for power lines and signal lines to be arranged in the same layer as the pad.

For this reason, usually an LCD driver uses a pad which is smaller than a bump electrode. Since the bump electrode is larger than the pad, it has an overlap region which overlaps the pad and a non-overlap region which does not overlap it, in a plan view. Therefore, space is available in the top layer of multilayer wiring layer under the non-overlap region of the bump electrode. Consequently, power lines and signal lines can be disposed in this space, permitting effective use of the space beneath the non-overlap region. Thus, by using a pad smaller than a bump electrode, wirings can be disposed under the bump electrode in addition to the pad, contributing to size reduction of the semiconductor chip (LCD driver).

Nevertheless, the presence of wirings in the top wiring layer under the bump electrode poses a problem which is explained below referring to drawings. FIG. 36 shows the coupling relation between top layer wirings and a bump electrode of a semiconductor chip which configures an LCD driver. As shown in FIG. 36, a pad PD and wirings L1 and L2 are formed in the top layer of an interlayer insulation film 100. Namely, the pad PD and wirings L1 and L2 are formed in the same layer. A surface protection film 101 is formed so as to cover the top wiring layer in which the pad and wirings are formed. This surface protection film 101 has an irregular surface which reflects the locations of the pad PD and wirings L1 and L2. Consequently, the bump electrode BP formed over the surface protection film 101 has a form which reflects the irregularities of the surface protection film 101. This bump electrode BP is electrically coupled with the pad PD through a plug SIL with a conductive material buried in its opening. The bump electrode BP, formed over the surface protection film 101, is larger than the pad PD and has an overlap region X which overlaps the pad PD and a non-overlap region Y which does not overlap it, in a plan view. In other words, no pad PD is formed in the top wiring layer beneath the non-overlap region Y of the bump electrode BP shown in FIG. 36 and some space is available. This space can be effectively used to dispose wirings L1 and L2 in the top wiring layer in addition to the pad PD so that the semiconductor chip (LCD driver) can be smaller.

However, if wirings L1 and L2 are disposed in the top wiring layer just beneath the non-overlap region Y of the bump electrode BP, irregularities which reflect the locations of the wirings L1 and L2 are generated on the surface protection film 101. Consequently the bump electrode BP formed over the surface protection film 101 has irregularities reflecting the irregularities of the film 101. If the bump electrode BP has such an irregular surface, there would be some difficulty in mounting the semiconductor chip on a glass substrate.

FIG. 37 is a sectional view showing how the semiconductor chip is mounted on a glass substrate. As illustrated in FIG. 37, a semiconductor chip is mounted on a glass substrate 103 by coupling the bump electrode BP of the semiconductor chip with the wiring 103a of a glass substrate 103 through an anisotropic conductive film ACF. If the bump electrode BP has an irregular surface, conductive particles 102 of the ACF fail to contact the bump electrode BP properly. As illustrated in FIG. 37, while the convex parts of the irregular surface of the bump electrode BP contact conductive particles 102, the concave parts cannot contact conductive particles 102 properly. The convex parts of the bump electrode BP, which are subjected to the pressure of the glass substrate 103, contact conductive particles 102, assuring electrical conductivity. On the other hand, the concave parts of the bump electrode BP are hardly subjected to the pressure of the glass substrate 103, making it difficult to assure electrical conductivity between the bump electrode BP and conductive particles 102.

Therefore, even if the bump electrode BP size is increased to assure conductivity between the glass substrate 103 and bump electrode BP through the ACF, surface irregularities of the bump electrode BP makes it difficult to improve reliability in coupling between the bump electrode BP and the wiring 103a formed over the glass substrate 103.

An object of the present invention is to provide a technique which increases reliability in coupling between the bump electrode of a semiconductor chip and the wiring of a mounting substrate. More particularly it is intended to provide a technique which increases reliability in coupling between a bump electrode and a wiring formed over a glass substrate by assuring the flatness of the bump electrode even when wirings lie in the top wiring layer under the bump electrode.

The above and further objects and novel features of the invention will more fully appear from the following detailed description in this specification and the accompanying drawings.

Preferred embodiments of the invention which will be disclosed herein are briefly outlined below.

According to a preferred embodiment of the present invention, a semiconductor device comprises (a) a semiconductor substrate, (b) a semiconductor element formed over the semiconductor substrate, (c) a multilayer wiring layer formed over the semiconductor element, and (d) a pad formed in the top layer of the multilayer wiring layer. It further comprises (e) a surface protection film which is formed over the pad and has an opening which reaches the pad, and (f) a bump electrode which is formed over the surface protection film and electrically coupled with the pad by filling the opening. The bump electrode is larger than the pad so as to have an overlap region which overlaps the pad in a plan view and a non-overlap region which does not overlap the pad in a plan view. Here, (g) a first wiring comprised of a power line or signal line in addition to the pad, and (h) a dummy pattern different from the first wiring are formed in the top layer of the multilayer wiring layer. The first wiring, formed in the same layer as the pad, is formed in the layer under the non-overlap region of the bump electrode.

Since a dummy pattern lies in the top layer of the multilayer wiring layer in addition to a power line or signal line, the flatness of the surface protection film formed over the top layer is increased. If only power lines or signal lines are formed in the top layer of the multilayer wiring layer, surface irregularities caused by the power or signal lines would be serious because the top layer cannot be densely filled with power or signal lines. On the other hand, by filling the layer with dummy patterns as well as power or signal lines, the flatness of the top layer is increased. Therefore, the flatness of the surface protection film formed over the top layer is guaranteed and the flatness of the bump electrode formed over the surface of the surface protection film is also increased.

According to a preferred embodiment of the present invention, a method of manufacturing a semiconductor device includes the steps of (a) forming a semiconductor element over a semiconductor substrate, (b) forming a multilayer wiring layer over the semiconductor element, and (c) forming a conductive film in the top layer of the multilayer wiring layer. These steps are followed by the steps: (d) forming a pad, a first wiring comprised of a power line or signal line, and a dummy pattern by patterning the conductive film, and (e) forming a surface protection film so as to cover the pad, the first wiring and the dummy pattern. The method further includes the steps of (f) making in the surface protection film an opening which reaches the pad, and (g) forming a bump electrode larger than the pad, over the surface protection film including the opening. Here at the step (g) the bump electrode is formed so as to have an overlap region which overlaps the pad in a plan view and a non-overlap region which does not overlap the pad in a plan view. The first wiring formed in the same layer as the pad is formed in the layer under the non-overlap region of the bump electrode formed at the step (g) and the dummy pattern is formed in a given area adjacent to the first wiring formed in the layer under the non-overlap region.

The advantageous effects brought about by preferred embodiments of the present invention disclosed herein are briefly described below.

Since a dummy pattern lies in the top layer of the multilayer wiring layer in addition to a power line or signal line, the flatness of the surface protection film formed over the top wiring layer is increased. If only power lines or signal lines are formed in the top layer of the multilayer wiring layer, surface irregularities caused by the power or signal lines would be serious because the top layer cannot be densely filled with power or signal lines. By forming the layer with dummy patterns as well as power or signal lines, the flatness of the top layer is increased. Therefore, the flatness of the surface protection film formed over the top layer is guaranteed and the flatness of the bump electrode formed over the surface of the surface protection film is also increased. Consequently the reliability in coupling between the bump electrodes of the semiconductor chip and the wirings of the mounting substrate is enhanced.

DETAILED DESCRIPTION OF THE PREFERRED EMBODIMENTS

Figure 1:
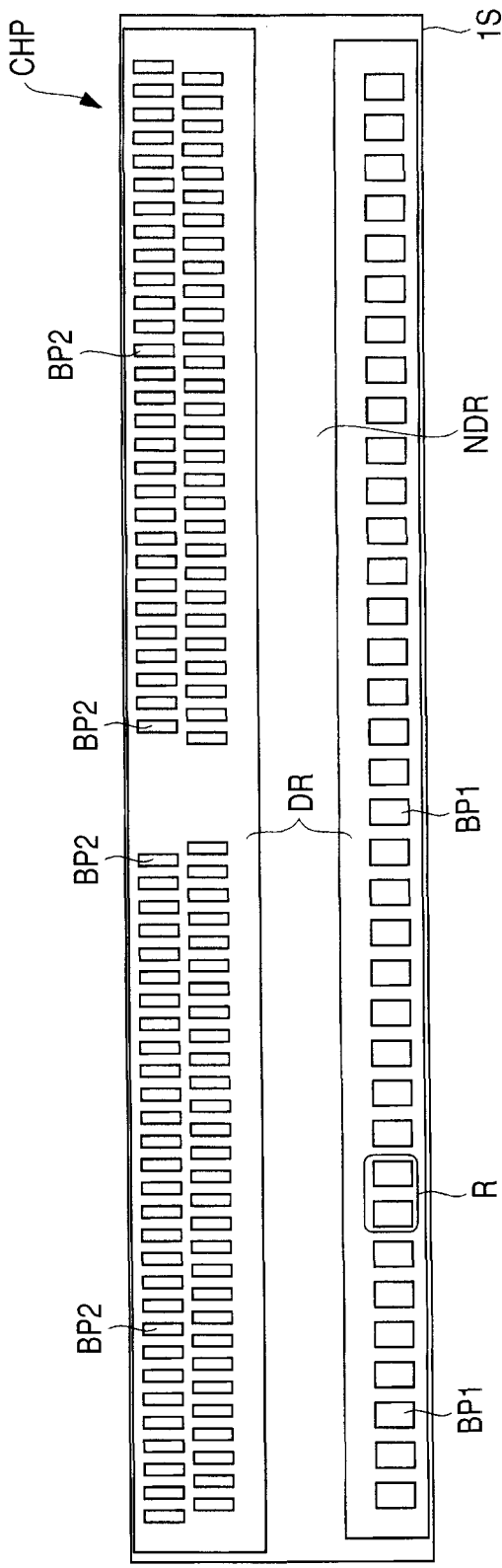
FIG. 1 is a plan view of a semiconductor chip according to an embodiment of the present invention.

The preferred embodiments described below will be described separately as necessary, but they are not irrelevant to each other unless otherwise specified. They are, in whole or in part, variations of each other and sometimes one description is a detailed or supplementary form of another.

Also, in the preferred embodiments described below, even when the numerical datum for an element (the number of pieces, numerical value, quantity, range, etc.) is indicated by a specific numerical figure, it is not limited to the indicated specific numerical figure unless otherwise specified or theoretically limited to the specific numerical figure; it may be larger or smaller than the specific numerical figure.

In the preferred embodiments described below, it is needles to say that their constituent elements (including constituent steps) are not necessarily essential unless otherwise specified or considered theoretically essential.

Likewise, in the preferred embodiments described below, when a specific form or positional relation is indicated for an element, it should be interpreted to include forms or positional relations which are virtually equivalent or similar to the specific one unless otherwise specified or unless the specific one is considered to be necessary theoretically. The same can be said of numerical values or ranges as mentioned above.

In all the drawings that illustrate the preferred embodiments, elements with like functions are basically designated by like reference numerals and repeated descriptions thereof are omitted. For easy understanding, hatching may be used even in a plan view.

FIG. 1 is a plan view showing a semiconductor chip CHP (semiconductor device) in an embodiment of the invention. The semiconductor chip CHP in this embodiment is an LCD driver. Referring to FIG. 1, for example, the semiconductor chip CHP includes a semiconductor substrate 1S which takes the form of an elongated rectangle, and an LCD driver which drives an LCD device is formed on its main surface. This LCD driver has the function of controlling the orientations of liquid crystal molecules by supplying voltage to each pixel in a cell array configuring the LCD and includes a gate drive circuit, a source drive circuit, a liquid crystal drive circuit, a graphic RAM (Random Access Memory), and a peripheral circuit. The functions of these elements are performed by semiconductor elements and wirings formed over the semiconductor substrate 1S. First, the surface configuration of the semiconductor chip CHP will be explained below.

The semiconductor chip CHP is a rectangle having a pair of short edges and a pair of long edges where bump electrodes BP1 are arranged in a row along one of the long edges (lower edge as seen in FIG. 1). The bump electrodes BP1 function as external connection terminals for coupling with an integrated circuit (LCD driver) including semiconductor elements and wirings formed inside the semiconductor chip CHP. The bump electrodes BP1 are bump electrodes for digital input signals or analog input signals.

Also, bump electrodes BP2 are arranged along the other long edge (upper edge as seen in FIG. 1). They are arranged in two rows in a zigzag pattern. This arrangement pattern permits the bump electrodes BP2 to be densely located. These bump electrodes BP2 also function as external connection terminals which couple the integrated circuit inside the semiconductor substrate 1S with the outside. The bump electrodes BP2 are bump electrodes for output signals from the LCD driver.

In this way, bump electrodes BP1 and bump electrodes BP2 are arranged along the pair of long edges on the periphery of the semiconductor chip CHP. The number of bump electrodes BP2 is larger than that of bump electrodes BP1; while the bump electrodes BP1 are disposed in line along one long edge, the bump electrodes BP2 are disposed in a zigzag pattern along the other long edge. The reason for this arrangement is that the bump electrodes BP1 are for input signals which go into the LCD driver and the bump electrodes BP2 are for output signals which come from the LCD driver. Since input signals which go into the LCD driver carry serial data, not so many bump electrodes BP1 as external connection terminals are required. On the other hand, output signals which come from the LCD driver carry parallel data and many bump electrodes BP2 as external connection terminals are required. More specifically, each of the bump electrodes BP2 for output signals is provided for a cell forming a liquid crystal display element (pixel), which means that as many bump electrodes BP2 as cells are required. Therefore, the number of bump electrodes BP2 for output signals is larger than that of bump electrodes BP1 for input signals. For this reason, the bump electrodes BP1 for input signals can be arranged in line along a long edge and the bump electrodes BP2 for output signals are arranged in a zigzag pattern along a long edge.

Although FIG. 1 shows that bump electrodes BP1 for input signals and bump electrodes BP2 for output signals are arranged along the pair of long edges of the semiconductor chip CHP, bump electrodes arranged along the pair of short edges may be added to these.

Next, the bump electrodes BP1 and BP2 will be described in detail. The bump electrodes BP1 and BP2 each take the form of a rectangle having short edges and long edges where their long edges are parallel to the short edges of the semiconductor chip CHP and they are arranged along the long edges of the semiconductor chip CHP. The bump electrodes BP1 and BP2 which are formed over the semiconductor chip CHP are larger in size (area) than general-purpose bump electrodes. In other words, the surface area ratio of bump electrodes BP1 and BP2 is larger. As will be described later, this is intended to assure coupling reliability in mounting the semiconductor chip CHP (LCD driver) on a glass substrate for a liquid crystal display device through an anisotropic conductive film. Therefore, while a general-purpose semiconductor chip does not have bump electrodes in an active region in which a semiconductor element is formed, a semiconductor chip CHP for an LCD driver has bump electrodes BP1 and BP2 in an active region.

Figure 2:
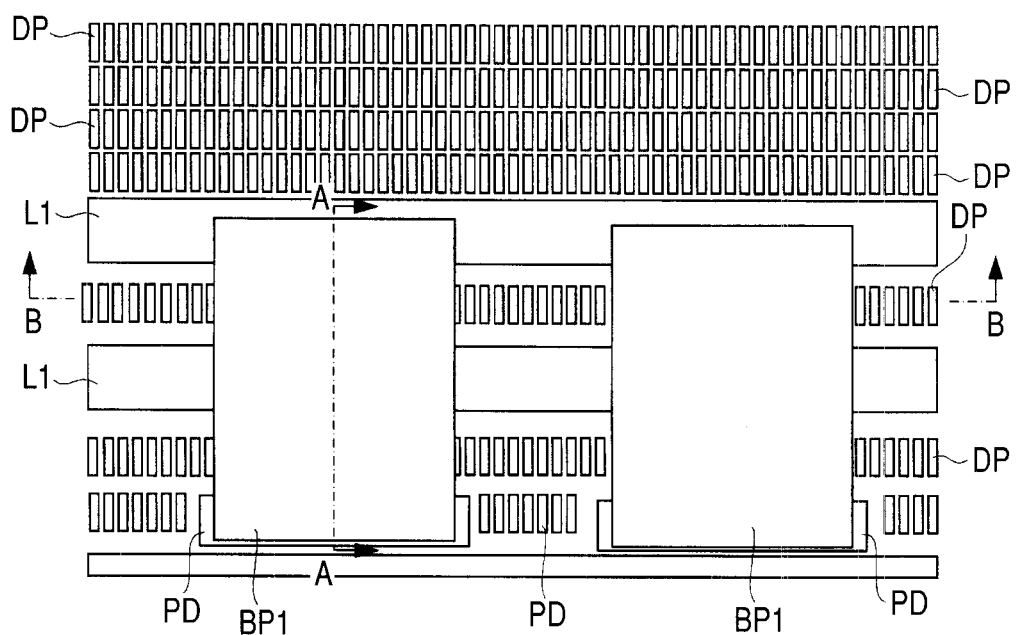
FIG. 2 is an enlarged view showing bump electrodes for input signals and their vicinities in the semiconductor chip shown in FIG. 1.

Bump electrodes BP1 are formed over the surface of the semiconductor chip CHP. Next, an explanation will be given of the positional relation between bump electrodes BP1 and a top wiring layer under them. FIG. 2 is an enlarged view showing a region R in FIG. 1. Referring to FIG. 2, bump electrodes BP1 lie side by side along a long edge of the semiconductor chip. FIG. 2 shows two neighboring bump electrodes BP1. These bump electrodes BP1 are formed over the surface protection film (passivation film) of the semiconductor chip and a top wiring layer is formed under the surface protection film. In FIG. 2, the surface protection film is omitted in order to illustrate the positional relation between the top wiring layer under the surface protection film and the bump electrodes BP1.

As shown in FIG. 2, the bump electrodes BP1 are coupled with pads PD formed in the top wiring layer. Each bump electrode BP1 is larger than the pad PD. In addition to the pad, a wiring L1 lies in the top wiring layer under the bump electrode. Namely, the wiring L1 extends along the long edge of the semiconductor chip CHP beneath the bump electrode BP1. Since the bump electrode BP1 is larger than the pad PD, some space is available in the top layer of the multilayer wiring layer beneath the bump electrode BP1. Therefore, the wiring L1 can be laid in this space for the effective use of the space beneath the bump electrode BP1. Thus, the use of the pad PD smaller than the bump electrode BP1 makes it possible to lay the wiring L1 under the bump electrode BP1 in addition to the pad PD, so the semiconductor chip CHP (LCD driver) can be smaller. The wiring L1 may be a power line or signal line.

As explained earlier, when a wiring L1 is formed beneath a bump electrode BP1, the surface protection film has an irregular surface reflecting the level difference between the wiring and the space; thus the bump electrode BP1 will be formed over the irregular surface of the surface protection film. As a consequence, the surface of the bump electrode BP1 will be not flat but irregular. If the surface of the bump electrode BP1 is irregular, there will be some difficulty in mounting the semiconductor chip on the glass substrate. Thus the surface of the bump electrode BP1 must be flat.

In this embodiment, dummy patterns DP are formed in the top wiring layer in which wirings L1 lie, as shown in FIG. 2. In the example of FIG. 2, dummy patterns DP are laid in regions adjacent to the wirings L1 in a way to fill the regions. Particularly the space between wirings L1 is filled with dummy patterns DP. Consequently the space beneath each bump electrode BP1 is filled with dummy patterns DP. In other words, a plurality of wirings L1, and dummy patterns DP formed between wirings L1 lie in the top wiring layer beneath the bump electrode BP1. This reduces the level difference between wirings and space in the layer under the bump electrode BP1 (top wiring layer). More specifically, dummy patterns DP, which have almost the same height as the wirings L1, are formed in the space available in the layer under the bump electrode BP1 (top wiring layer), so the level difference in the layer under the bump electrode BP1 (top wiring layer) is reduced by the wirings L1 and dummy patterns.

In the top wiring layer, in addition to the dummy patterns DP disposed parallel to the wirings L1 beneath the bump electrodes BP1, dummy patterns DP are formed in regions which are not beneath the bump electrodes BP1. Namely, dummy patterns DP are disposed adjacent to the wirings L1 in regions which do not overlap the bump electrodes in a plan view. Formation of dummy patterns DP in the space beneath a bump electrode BP1 is considered necessary to eliminate the level difference between the wiring L1 beneath the bump electrode BP1 and the space. The question is whether or not it is advantageous to form dummy patterns DP adjacent to the wirings L1 in regions which do not overlap the bump electrodes BP1 in a plan view. However, even in a region not beneath a bump electrode BP1, there would be a level difference between a wiring L1 and space. If there should be this kind of level difference near a bump electrode BP1, it would affect the flatness of the bump electrode BP1. For this reason, in this embodiment, dummy patterns DP are laid not only in the layer beneath the bump electrode BP1 (top wiring layer) but in a region within a given distance from the bump electrode BP1 to guarantee the flatness of the bump electrode BP1.

Figure 3:
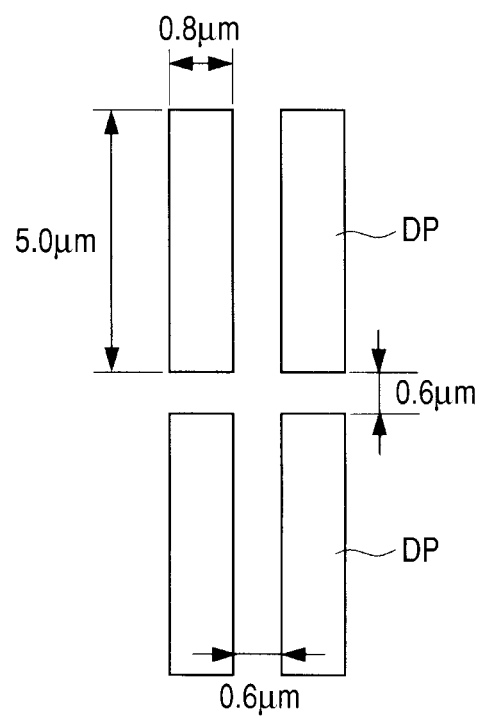
FIG. 3 is an enlarged view showing an arrangement of dummy patterns shown in FIG. 2.

Next, the arrangement of dummy patterns DP will be described. FIG. 3 shows an arrangement of dummy patterns DP. As illustrated in FIG. 3, each dummy pattern DP is a rectangle having short edges and long edges and such dummy patterns DP are arranged vertically and horizontally as seen in the figure to fill the space. For example, each dumpy pattern has a long edge of 5.0 µm and a short edge of 0.8 µm. Since a wiring L1 typically has a width of 20-30 µm, both the short edge and long edge of the dummy pattern DP are smaller than the width of the wiring L1. Namely each dummy pattern DP is very small. This means that even when the space between wirings L1 is smaller than the width of the wiring L1, the small space can be filled with dummy patterns. Thus, since even a small space can be filled with dummy patterns DP, the flatness of the top wiring layer can be high enough. Particularly, as illustrated in FIG. 3, each dummy pattern itself is small and the interval between dummy patterns DP is, for example, as small as 0.6 μm. In other words, the interval between dummy patterns DP is smaller than the short edge of the dummy pattern DP so that the space is densely filled with dummy patterns.

Figure 4:
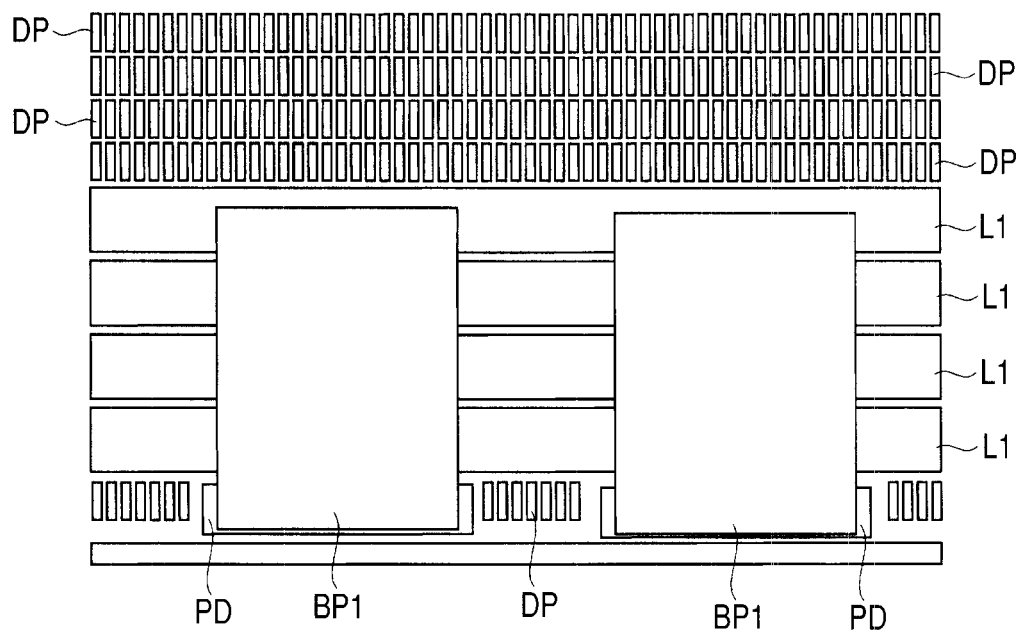
FIG. 4 is an enlarged view showing bump electrodes for input signals and their vicinities in the semiconductor chip shown in FIG. 1.

FIG. 4 shows an example of arrangement of dummy patterns DP which is different from the one shown in FIG. 2. As illustrated in FIG. 4, the layer under bump electrodes BP1 (top wiring layer) is occupied by a plurality of wirings L1. In other words, wirings L1 are densely disposed and no space is available for dummy patterns DP in the layer under the bump electrodes BP1 (top wiring layer). Therefore, in the example of FIG. 4, it seems that there is no problem of level difference in the layer under bump electrodes BP1 (top wiring layer). However, as illustrated in FIG. 4, while wirings L1 are formed so as to fill the regions beneath the bump electrodes BP1, no wirings L1 are formed in the peripheral regions which do not overlap the bump electrodes BP1 in a plan view. Specifically, the peripheral regions of the bump electrodes BP1 include both regions with wirings L1 formed in the top wiring layer and regions without wirings (space). Thus, there will be a level difference between a wiring L1 and the space. For the purpose of assuring the flatness of bump electrodes BP1, it is important to reduce such a level difference beneath each bump electrode BP1. Since even a level difference in the peripheral region of the bump electrode BP1 affects the flatness of the bump electrode BP1, this level difference in the peripheral region should also be reduced in the top wiring layer. This is because, in the example of FIG. 4, dummy patterns DP are also formed in regions adjacent to wirings L1 (peripheral regions of bump electrodes BP1). Consequently, level differences in the peripheral regions of bump electrodes BP1 are reduced in the top wiring layer and the flatness of bump electrodes BP1 formed over the top wiring layer is guaranteed. As FIGS. 2 and 4 indicate, it is apparent that when there are wirings L1 and space beneath a bump electrode BP1, it is most effective to form dummy patterns DP so as to fill the space and it is also effective to form dummy patterns DP in the top wiring layer even in a peripheral region within a given distance from the bump electrode BP. The positional relation between bump electrodes BP1 and dummy patterns DP formed in the layer beneath bump electrodes BP1 (top wiring layer) has been explained above. The same is true of the positional relation between bump electrodes BP2 and dummy patterns DP.

Figure 5:
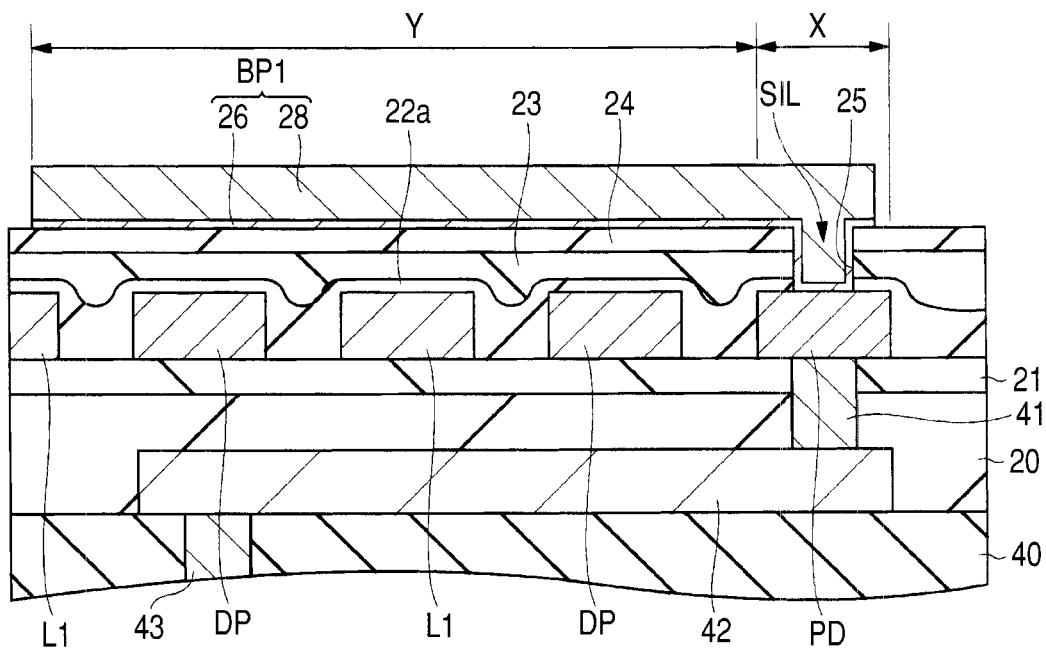
FIG. 5 is a sectional view taken along the line A-A in FIG. 2.

Next, dummy patterns DP are explained referring to sectional views. FIG. 5 is a sectional view taken along the line A-A in FIG. 2. FIG. 5 shows only the multilayer wiring layer's upper part including the top wiring layer and omits its part under the top wiring layer.

As illustrated in FIG. 5, a wiring 42 is formed over a silicon oxide film 40 as an interlayer insulation film. This wiring 42 is coupled with a wiring under it through a plug 43. Although wirings and a semiconductor element which are under the plug 43 formed in the silicon oxide film 40 are not shown in FIG. 5, a multilayer wiring and a semiconductor element like MISFET are formed under the wiring 42. An interlayer insulation film is formed in a way to cover the wiring 42. The interlayer insulation film is comprised of a silicon oxide film 20 and a silicon oxide film 21 of TEOS (Tetra Ethyl Ortho Silicate) formed over the silicon oxide film 20. A top wiring layer is formed over the interlayer insulation film. The top wiring layer includes a pad, wirings L1 and dummy patterns DP. The pad PD, wirings L1 and dummy patterns DP are formed by patterning a conductive film and they have the same thickness. Namely the height of the wirings L1 is almost the same as that of the dummy patterns DP. The pad PD is electrically coupled with the wiring 42 by a plug 41 penetrating the silicon oxide film 20 and silicon oxide film 21. In other words, the pad PD is electrically coupled with the semiconductor element through the wiring 42 and wirings under it. A silicon oxide film 22a is formed so as to cover the top wiring layer and a silicon oxide film 23 of TEOS is formed over the silicon oxide film 22a. Also a silicon nitride film 24 is formed over the silicon oxide film 23. The silicon oxide film 22a, silicon oxide film 23 and silicon nitride film 24 configure a surface protection film (passivation film). The surface protection film is intended to protect the semiconductor chip from mechanical stress or impurities. Therefore, the surface protection film is required to function as a barrier against mechanical strength or polluting impurities such as mobile ions. For example, as illustrated in FIG. 5, it is a laminate comprised of the silicon oxide film 22a, silicon oxide film 23 and silicon nitride film 24.

An opening 25 which reaches the pad PD is made in the surface protection film and a plug SIL is formed by burying a conductive material in the opening 25. A bump electrode BP1 which is electrically coupled with the plug SIL is formed over the surface protection film. The bump electrode BP1 is, for example, comprised of a UBM (Under Bump Metal) film 26 and a gold film 28.

The bump electrode BP1, larger than the pad PD, extends over the surface protection film. Therefore, in a plan view, the bump electrode BP1 has an overlap region X which overlaps the pad PD and a non-overlap region Y which does not overlap the pad. Wirings L1 lie in the layer under the non-overlap region Y (top wiring layer). Also a dummy pattern DP lies between the wirings L1. Therefore, if only wirings L1 lie in the layer under the non-overlap region Y (top wiring layer), irregularities due to the level difference between the wirings L1 and space would be generated and the surface protection film, reflecting the level difference, would be irregular. As a consequence, the surface of the bump electrode BP1 formed over the surface protection film would be irregular. However, in this embodiment, dumpy patterns DP which have the same height as the wirings L1 are formed so as to fill the space between wirings L1, so level differences in the layer under the non-overlap region Y (top wiring layer) can be reduced. Therefore the flatness of the surface protection film formed over the top wiring layer is improved and the flatness of the bump electrode BP1 formed over the surface protection film is also improved.

In sum, one feature of this embodiment (first feature) is that wirings L1 and dummy patterns DP are formed in the layer under the non-overlap region Y (top wiring layer) of a bump electrode BP1 and the dummy patterns have the same height as the wirings L1 and lie in the space between wirings L1, thereby reducing level differences in the top wiring layer. As a consequence, the flatness of the bump electrode BP1 is increased. Therefore, in this embodiment, wirings L1 (power lines or signal lines) can be disposed in the layer under the non-overlap region Y (top wiring layer) of the bump electrode BP1, so the region beneath a large bump electrode BP1 can be effectively used. Furthermore, deterioration in the flatness of the bump electrode BP1 which may be caused by the presence of wirings L1 in the layer under the non-overlap region Y (top wiring layer) is alleviated by filling the space between wirings L1 with dummy patterns DP. As explained above, according to this embodiment 1, the semiconductor chip can be smaller and the flatness of the bump electrode BP1 can be increased, so the reliability in coupling between the semiconductor chip and substrate can be increased.

Another feature of the embodiment (second feature) is that the surface protection film is flattened. As described above, dummy patterns DP are formed along with wirings L1 in the top wiring layer to reduce irregularities in the top wiring layer. However, as shown in FIG. 5, some irregularities will remain on the silicon oxide film 22a formed so as to cover the top wiring layer. In order to make the surface protection film flatter, the silicon oxide film 23 of TEOS is formed over the silicon oxide film 22a. The surface of the silicon oxide film 23 is flattened by chemical mechanical polishing (CMP). Thus the surface of the silicon oxide film 23 as part of the surface protection film is flattened. In sum, after the silicon oxide film 22a is formed over the top wiring layer, the silicon oxide layer 23 is formed over the silicon oxide film 22a and its surface is flattened to increase the flatness of the surface protection film. Since the silicon nitride film 24 is formed over the silicon oxide film 23 which has been flattened by CMP, it is also flat. Thus the flatness of the surface protection film covering the top wiring layer is surely increased. As a consequence, the bump electrode BP1 is formed over the flattened surface protection film and the flatness of the bump electrode BP1 is guaranteed. Since the surface of the surface protection film is the silicon nitride film 24, it may be possible to polish the surface of not the silicon oxide film 23 but the silicon nitride film 24 by CMP. However, because of its nature, the silicon nitride film 24 is not suitable to be polished by an ordinary CMP process. For this reason, the surface of the silicon oxide film 23 underlying the silicon nitride film 24 is flattened by CMP. In other words, since the silicon oxide film 23 is easy to polish by CMP, the surface protection film is flattened by flattening the silicon oxide film 23.

As described above, in this embodiment, the first feature that the top wiring layer is filled with dummy patterns DP and the second feature that the surface protection film covering the top wiring layer is flattened by CMP are combined to ensure that the bump electrode BP1 formed over the surface protection film is flattened. However, it is not indispensable to combine the first feature and the second feature; the bump electrode BP1 is flattened by adopting either the first feature or the second feature.

Figure 6:
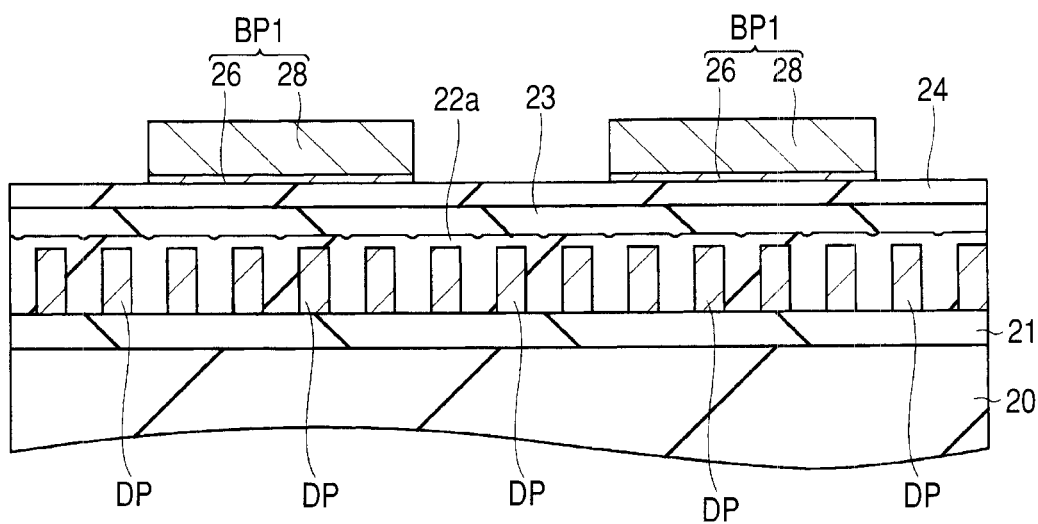
FIG. 6 is a sectional view taken along the line B-B in FIG. 2.

FIG. 6 is a sectional view taken along the line B-B in FIG. 2. As illustrated in FIG. 6, dummy patterns DP in the top wiring layer are disposed in line along the array of bump electrodes BP1. These dummy patterns DP extend in the same direction as wirings L1 (not shown in FIG. 6) but they are an array of dummy patterns unlike the wirings L1 which are each a single line. Each dummy pattern DP is a small rectangle whose short edges and long edges are smaller than the width of each wiring L1. The space in the top wiring layer is filled with such small rectangular dummy patters D1.

The use of small rectangular dummy patterns offers two advantages which will be explained below. The first advantage is that the space in the top wiring layer can be filled adequately regardless of space size. More specifically, a plurality of wirings L1 are formed in the top wiring layer and the interval between certain neighboring wirings L1 is larger than that that between other ones. If the dummy pattern size is as large as the width of wiring L1, a narrow interval between wirings cannot be filled with dummy patterns DP. On the other hand, if the short and long edges of a dummy pattern DP are both smaller than the width of wiring L1, even a relatively small interval (space) can be filled with dummy patterns DP. Thanks to the smallness of the dummy pattern DP, various forms of space can be filled with dummy patterns without the need for changing the dummy pattern form.

Figure 7:
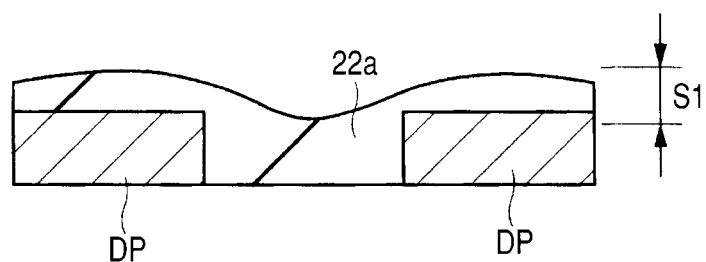
FIG. 7 illustrates the relation between the size of dummy patterns and the irregular surface of the silicon oxide film covering the dummy patterns.
Figure 8:
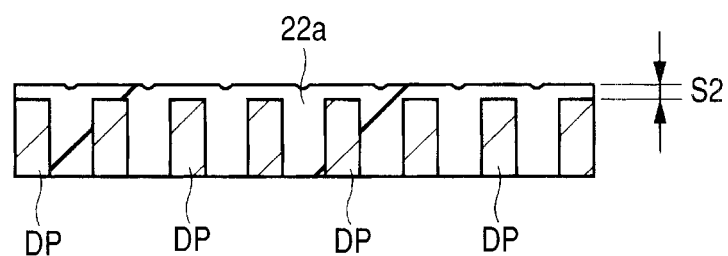
FIG. 8 illustrates the relation between the size of dummy patterns and the irregular surface of the silicon oxide film covering the dummy patterns.

The second advantage of small dummy patterns DP is as follows. For example, if the dummy pattern size is larger and the interval between dummy patterns DP is wider as shown in FIG. 7, the depth S1 of surface irregularity of the silicon oxide film 22a formed to cover the dummy patterns DP is larger. This is not desirable from the viewpoint that the purpose of dummy patterns DP in the top wiring layer is to reduce irregularities in the top wiring layer. On the other hand, as shown in FIG. 8, if the dummy pattern size is small and the interval between dummy patterns DP is narrower, the depth S2 of surface irregularity of the silicon oxide film 22a formed to cover the dummy patterns DP is smaller. This is desirable from the viewpoint that the purpose of dummy patterns DP in the top wiring layer is to reduce irregularities in the top wiring layer. Thus, smaller dummy patterns DP and a narrower interval between dummy patterns DP are better for the purpose of increasing the bump electrode flatness.

The positional relation between the bump electrodes BP1 for input signals and the top wiring layer in the semiconductor chip has been explained so far. Next, the positional relation between the bump electrodes BP2 for output signals and the top wiring layer will be explained. The positional relation between the bump electrodes BP2 for output signals and the top wiring layer is similar to that between the bump electrodes BP1 for input signals and the top wiring layer.

Figure 9:
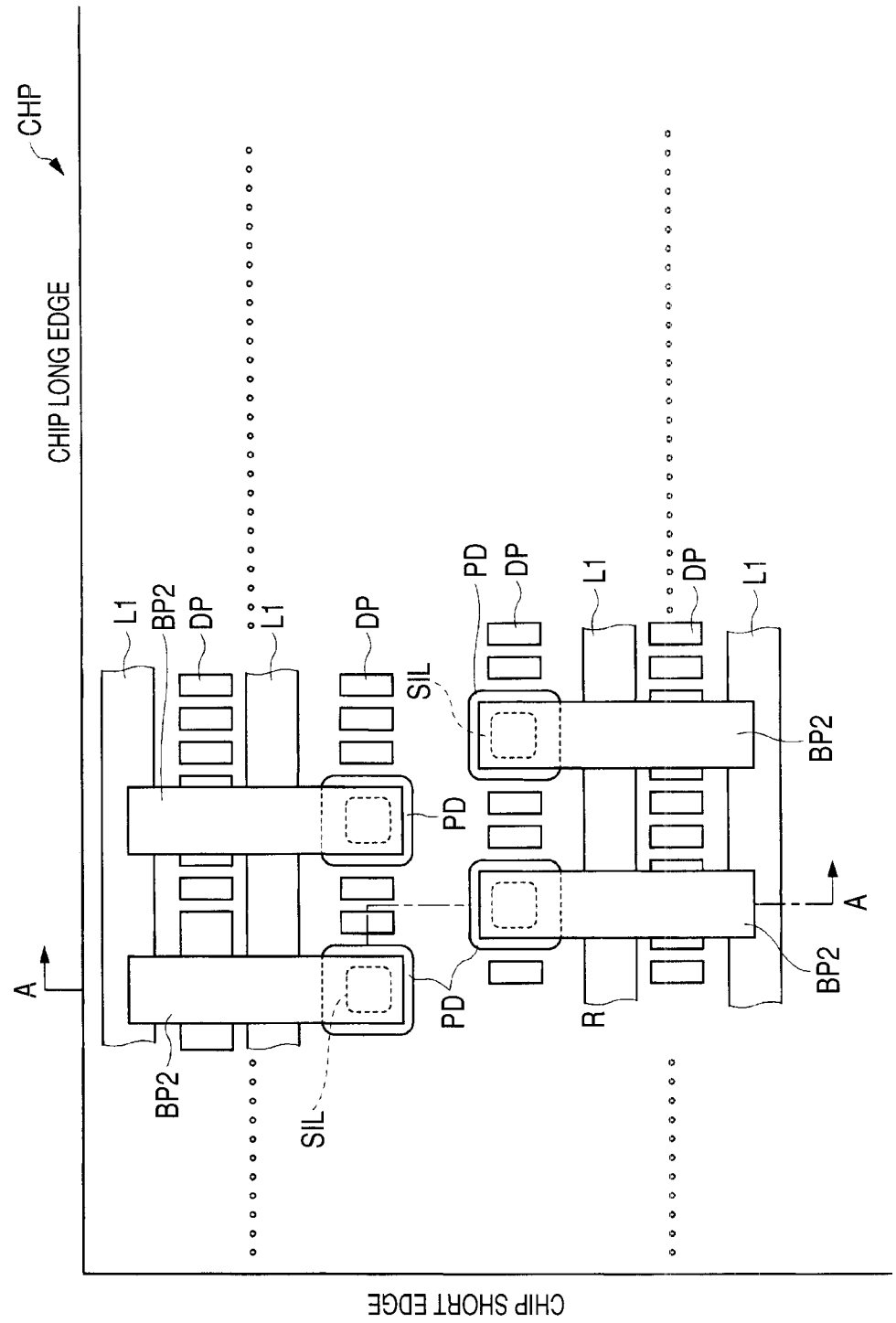
FIG. 9 is an enlarged view showing bump electrodes for output signals and their vicinities in the semiconductor chip shown in FIG. 1.

FIG. 9 is an enlarged view of a corner of the semiconductor chip and its vicinity. In FIG. 9, the horizontal direction represents the long edge direction of the semiconductor chip CHP and the vertical direction represents the short edge direction of the chip. As illustrated here, bump electrodes BP2 for output signals are disposed in line along the long edge direction of the semiconductor chip CHP. Particularly, the bump electrodes BP2 for output signals are arranged in two rows in a zigzag pattern. This arrangement permits many bump electrodes BP2 to lie densely along the long edge direction of the chip CHP.

Each bump electrode BP2 takes the form of a rectangle having short edges and long edges and a pad PD lies in the top wiring layer under part of the bump electrode BP2. The pad PD and the bump electrode BP are electrically coupled by a plug SIL. In this embodiment, the bump electrode BP2 is larger than the pad and plug and is coupled with the pad PD, smaller than the bump electrode BP2, by the plug SIL, smaller than the pad PD. However, the short edge of the bump electrode BP2 is shorter than the pad PD. This is because, if the short edge of the bump electrode BP2 should be longer than the pad PD, the vicinity of the short edge of the bump electrode BP2 would have an irregular surface as a reflection of the level difference between the pad area and non-pad area in the top wiring layer. Therefore, for the purpose of assuring the flatness of the vicinity of the short edge of the bump electrode BP2, it is desirable that the whole short edge of the bump electrode BP2 be over the pad PD.

In addition to the pad PD, wirings L1 and dummy patterns DP under the long edge of each bump electrode BP2. The long edge of the bump electrode BP2 is far longer than the pad PD, which means that there is some space beneath the bump electrode BP2 in the top wiring layer. Again, wirings L1 are laid under the bump electrode BP2 for output signals in order to effectively use the space available in the top wiring layer. These wirings L1 are, for example, power lines or signal lines. They lie just beneath bump electrodes BP2 and extend along the long edge of the semiconductor chip CHP along which bump electrodes BP2 are disposed in rows.

When a wiring L1 is formed beneath a bump electrode BP1 in this way, the surface protection film has an irregular surface reflecting the level difference between the wiring and the space; thus the bump electrode BP1 will be formed over the irregular surface of the surface protection film. As a consequence, the surface of the bump electrode BP2 will be not flat but irregular. If the surface of the bump electrode BP2 is irregular, there will be some difficulty in mounting the semiconductor chip on the glass substrate. Thus the surface of the bump electrode BP2 must be flat.

Therefore, in this embodiment, dummy patterns DP are formed beneath bump electrodes BP2 for output signals in the top wiring layer in which wirings L1 lie, as in the case of bump electrodes BP1 for input signals. In the example of FIG. 9, dummy patterns DP are laid in regions adjacent to wirings L1 in a way to fill the regions. Particularly the space between wirings L1 is filled with dummy patterns DP. Consequently the space beneath each bump electrode BP1 is filled with dummy patterns DP. In other words, a plurality of wirings L1, and dummy patterns DP formed between wirings L1 lie in the top wiring layer beneath the bump electrode BP2. This reduces the level difference between wirings and space in the layer under the bump electrode BP2 (top wiring layer). More specifically, dummy patterns DP, which have almost the same height as the wirings L1, are formed in the space available in the layer under the bump electrode BP2 (top wiring layer), so the level difference in the layer under the bump electrode BP2 (top wiring layer) is reduced by the wirings L1 and dummy patterns.

Figure 10:
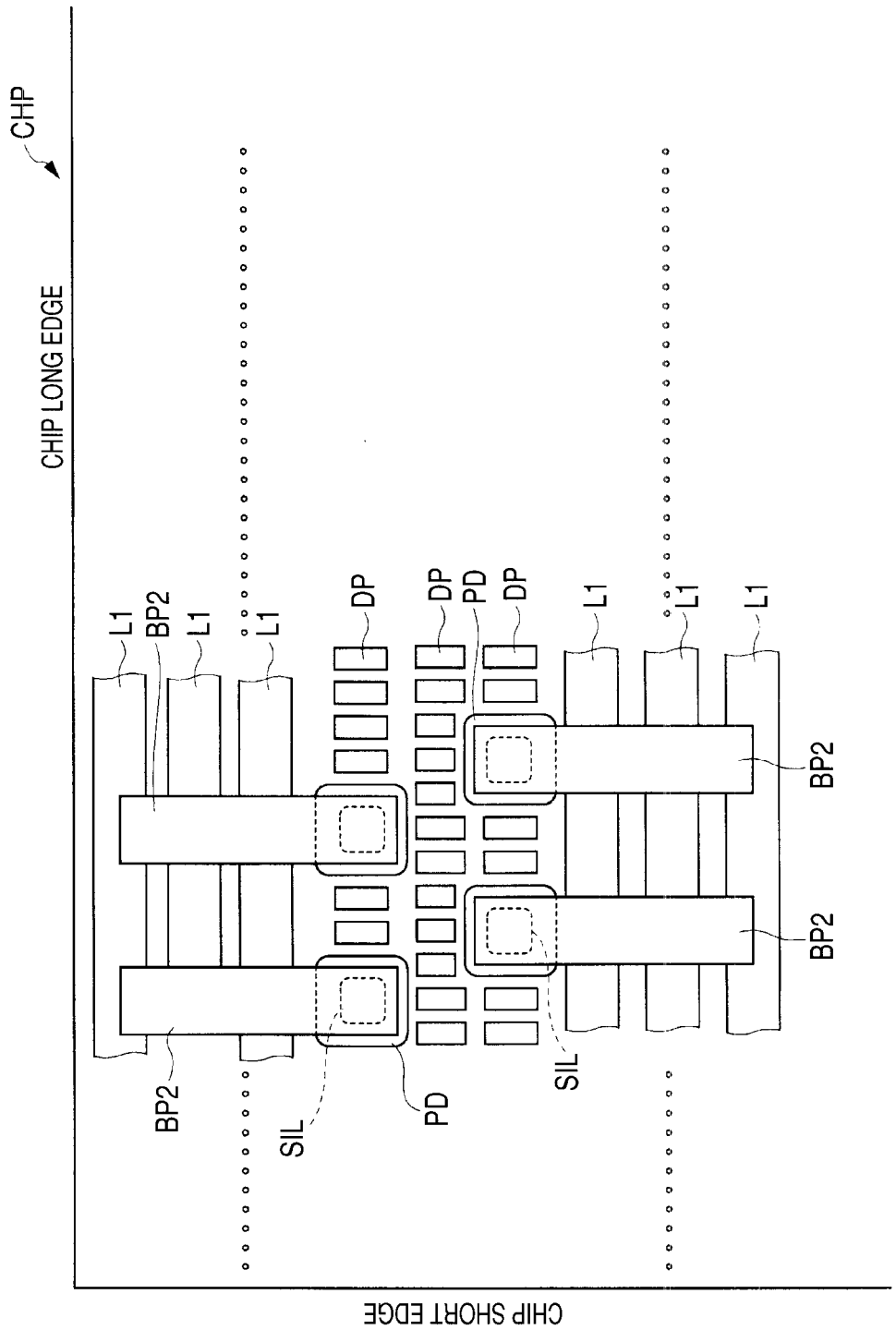
FIG. 10 is a variation of what is shown in FIG. 9.

FIG. 10 shows an example of arrangement of dummy patterns DP which is different from the one shown in FIG. 9. As illustrated in FIG. 10, the layer under bump electrodes BP2 (top wiring layer) is occupied by a plurality of wirings L1. In other words, wirings L1 are densely disposed and no space is available for dummy patterns DP in the layer under the bump electrodes BP2 (top wiring layer). Therefore, in the example of FIG. 10, it seems that there is no problem of level difference in the layer under bump electrodes BP2 (top wiring layer). However, as illustrated in FIG. 10, while wirings L1 are formed so as to fill the region beneath the bump electrodes BP2, no wirings L1 are formed in the peripheral regions which do not overlap the bump electrodes BP2 in a plan view. Specifically, the peripheral regions of the bump electrodes BP2 include both regions with wirings L1 formed in the top wiring layer and regions without wirings (space). Thus, there will be a level difference between wiring L1 and the space. For the purpose of assuring the flatness of bump electrodes BP2, it is important to reduce such a level difference beneath each bump electrode BP2. Since even a level difference in the peripheral region of the bump electrode BP2 affects the flatness of the bump electrode BP2, this level difference in the peripheral region of the bump electrode BP2 should also be reduced in the top wiring layer. This is because, in the example of FIG. 10, dummy patterns DP are also formed in regions adjacent to wirings L1 (peripheral regions of bump electrodes BP2). Consequently, level differences in the peripheral regions of the bump electrodes BP2 are reduced in the top wiring layer and the flatness of bump electrodes BP2 formed over the top wiring layer is guaranteed.

Figure 11:
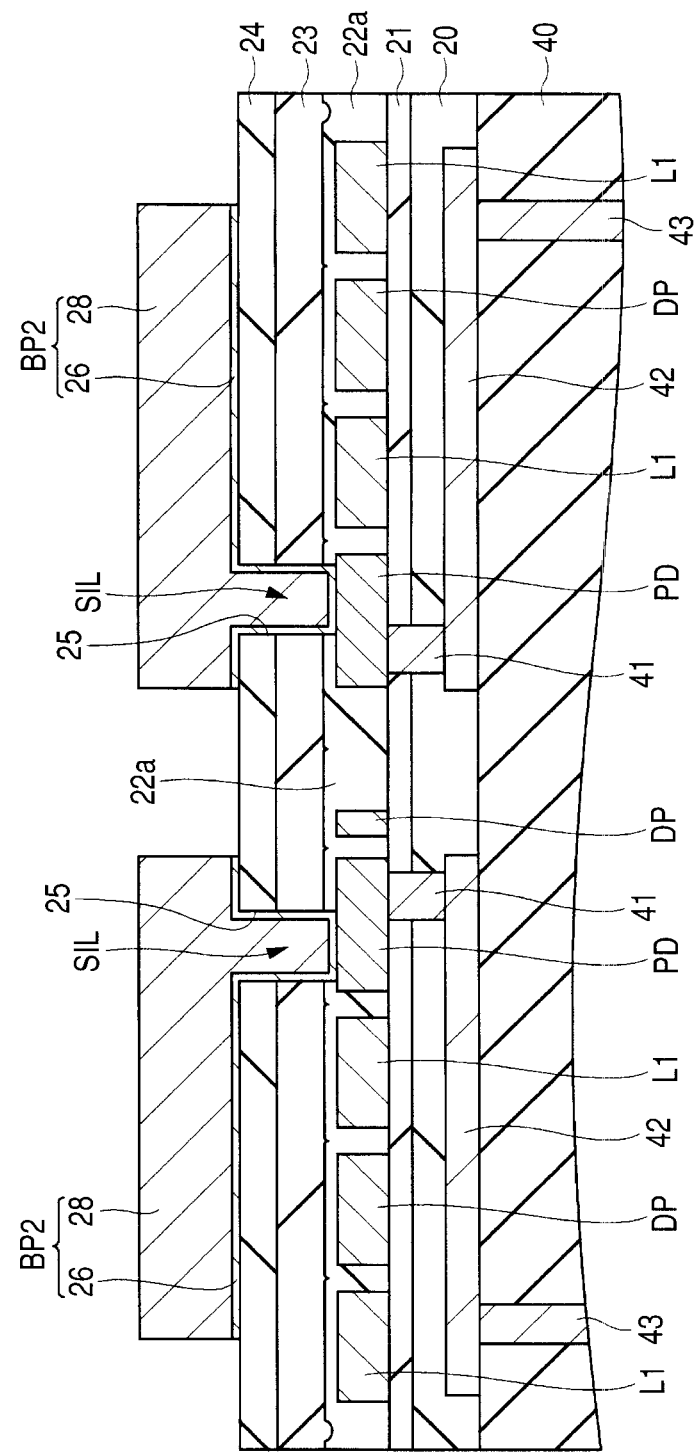
FIG. 11 is a sectional view taken along the line A-A in FIG. 9.

FIG. 11 is a sectional view taken along the line A-A in FIG. 9. As shown in FIG. 11, wiring 42 is formed over a silicon oxide film 40 as an interlayer insulation film. This wiring 42 is coupled with wiring under it through a plug 43. Although wirings and a semiconductor element which are under the plug 43 formed in the silicon oxide film 40 are not shown in FIG. 11, a multilayer wiring and a semiconductor element like MISFET are formed under the wiring 42. An interlayer insulation film is formed in a way to cover the wiring 42. The interlayer insulation film is comprised of a silicon oxide film 20 and a silicon oxide film 21 of TEOS (Tetra Ethyl Ortho Silicate) formed over the silicon oxide film 20. A top wiring layer is formed over the interlayer insulation film. The top wiring layer includes pads PD, wirings L1 and dummy patterns DP. The pads PD, wirings L1 and dummy patterns DP are formed by patterning a conductive film and they have the same thickness. Namely the height of the wirings L1 is almost the same as that of the dummy patterns DP. Each pad PD is electrically coupled with the wiring 42 by a plug 41 penetrating the silicon oxide film 20 and silicon oxide film 21. In other words, the pad PD is electrically coupled with the semiconductor element through the wiring 42 and wirings under it. A silicon oxide film 22a is formed so as to cover the top wiring layer and a silicon oxide film 23 of TEOS is formed over the silicon oxide film 22a. Also a silicon nitride film 24 is formed over the silicon oxide film 23. The silicon oxide film 22a, silicon oxide film 23 and silicon nitride film 24 configure a surface protection film (passivation film).

An opening 25 which reaches the pad PD is made in the surface protection film and a plug SIL is formed by burying a conductive material in the opening 25. A bump electrode BP1 which is electrically coupled with the plug SIL is formed over the surface protection film. The bump electrode BP2 is, for example, comprised of a UBM (Under Bump Metal) film 26 and a gold film 28.

The bump electrode BP2, larger than the pad PD, extends over the surface protection film. Therefore, in a plan view, the bump electrode BP2 has an overlap region X which overlaps the pad PD and a non-overlap region Y which does not overlap the pad. Wirings L1 lie in the layer under the non-overlap region Y (top wiring layer). Also a dummy pattern DP lies between wirings L1. Therefore, if only wirings L1 lie in the layer under the non-overlap region Y (top wiring layer), irregularities due to the level difference between wirings L1 and space would be generated and the surface protection film, reflecting the level difference, would be irregular. As a consequence, the surface of the bump electrode BP2 formed over the surface protection film would be irregular. However, in this embodiment, dumpy patterns DP which have the same height as the wirings L1 are formed so as to fill the space between wirings L1, so level differences in the layer under the non-overlap region Y (top wiring layer) can be reduced. Therefore, the flatness of the protection film formed over the top wiring layer is improved and the flatness of the bump electrode BP2 formed over the surface protection film is also improved.

Furthermore, one feature of this embodiment is that the surface protection film formed under bump electrodes BP2 for output signals is flattened. For example, the surface of the silicon oxide film 23 as part of the surface protection film is flattened by chemical mechanical polishing (CMP) or a similar technique. The surface of the silicon oxide film 23 is thus flattened. In sum, after the silicon oxide film 22a is formed over the top wiring layer, the silicon oxide layer 23 is formed over the silicon oxide film 22a and its surface is flattened to increase the flatness of the surface protection film. Since the silicon nitride film 24 is formed over the silicon oxide film 23 which has been flattened by CMP, it is also flat. Thus the flatness of the surface protection film covering the top wiring layer is surely increased. As a consequence, the bump electrode BP2 is formed over the flattened surface protection film and the flatness of the bump electrode BP2 is thus guaranteed.

Thus, this embodiment has the first feature that the top wiring layer under bump electrodes BP2 for output signals is also filled with dummy patterns DP and the second feature that the surface protection film covering the top wiring layer is flattened by CMP.

The first feature of this embodiment is that dummy patterns DP are formed both beneath bump electrodes BP1 for input signals and beneath bump electrodes BP2 for output signals.

As a consequence, the space in the top wiring layer is filled with dummy patterns and the surface protection film covering the top wiring layer has a higher degree of flatness, resulting in a higher degree of flatness of bump electrodes BP1 and BP2 formed over the surface protection film.

Therefore, from the viewpoint that the level differences between the wirings L1 in the top wiring layer and the space between wirings L1 should be eliminated, it may be desirable that dummy patterns DP be formed all over the semiconductor chip. In other words, for the purpose of increasing the flatness of the surface protection film covering the top wiring layer and the flatness of bump electrodes BP1 formed over the surface protection film, it may be desirable that dummy patterns be formed so as to fill the whole space in the top wiring layer.

However, in this embodiment, dummy patterns DP are not formed throughout the top wiring layer. For example, FIG. 1 shows that the top wiring layer of the semiconductor chip CHP includes dummy pattern regions DR where dummy patterns are formed and a non-dummy pattern region NDR where dummy patterns are not formed. The dummy pattern regions are formed within a given distance from bump electrodes BP1 and BP2. This is because, in order to achieve the flatness of bump electrodes BP1 and BP2, level differences in the top wiring layer which would directly affect the flatness of the bump electrodes BP1 and BP2 are eliminated by forming dummy patterns at least just beneath the bump electrodes BP1 and BP2 and in their peripheral regions. In short, for achieving the flatness of bump electrodes BP1 and BP2, it is not necessary to fill the whole space in the top wiring layer with dummy patterns. In other words, the nun-dummy pattern region NDR does not affect the flatness of bump electrodes BP1 and BP2.

In this embodiment, dummy pattern regions DR are not provided all over the semiconductor chip CHP surface for the following reasons. The first reason is for the sake of convenience for semiconductor chip defect analysis. The LCD driver semiconductor chips CHP shipped as products may include some defective products. Defective products are collected from customers and subjected to defect analysis. If dummy patterns are formed in the whole space in the top wiring layer, the inside of the semiconductor chip is shielded by the metal film used in dummy patterns. A semiconductor element and multilayer wiring are formed inside the semiconductor chip CHP. When defect analysis is to be made on the semiconductor element and multilayer wiring, dummy patterns in the top wiring layer may hamper such defect analysis. For this reason, dummy patterns are not formed all over the top wiring layer. Therefore, dummy patterns are formed within a given distance from the bump electrodes BP1 and BP2. Concretely, dummy pattern regions DR are within 70 μm from bump electrodes BP1 and BP2 and the rest is a non-dummy pattern region NDR where no dummy patterns are formed, thereby contributing to convenience for defect analysis. In other words, in this embodiment, the flatness of bump electrodes BP1 and BP2 is increased by forming dummy patterns only in regions which affect the flatness of bump electrodes BP1 and BP2 (part of the top wiring layer) and the convenience for defect analysis is enhanced by not forming dummy patterns in the other regions.

Figure 12:
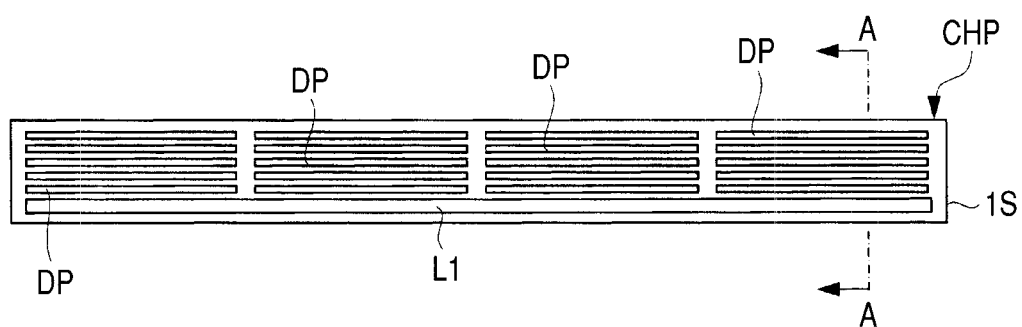
FIG. 12 shows that wirings and dummy patterns formed in the top wiring layer occupy less than 70% of the semiconductor chip area.
Figure 13:
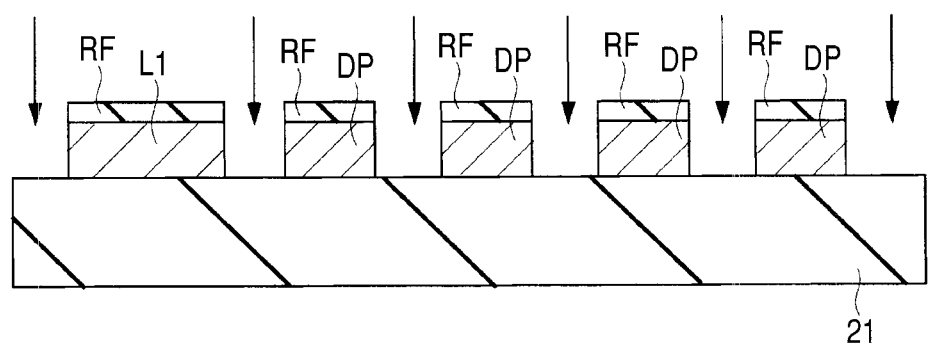
FIG. 13 is a sectional view taken along the line A-A in FIG. 12.

The second reason that dummy pattern regions DR are not formed all over the semiconductor chip CHP surface is as follows. FIG. 12 shows a case that the wirings L1 and dummy patterns DP formed in the top wiring layer of the semiconductor chip CHP occupy less than 70% of the layer. Namely FIG. 12 shows a case that the ratio of dummy patterns DP in the top wiring layer is relatively low. FIG. 13 is a fragmentary sectional view taken along the line A-A in FIG. 12 showing a dummy pattern forming process. As illustrated in FIG. 13, a conductive film, from which wirings L1 and dummy patterns DP are formed, lies over the silicon oxide film 21 as an interlayer insulation film and a patterned resist film RF is formed over the conductive film. Resist film patterning is done so that resist film is left in regions where wirings L1 and dummy patters DP are to be formed. Wirings L1 and dummy patterns DP are formed by etching the conductive film using the patterned resist film RF as a mask. When the ratio of dummy patterns DP is as low as less than 70%, the ratio of conductive film removed by etching is high. This means that the area to be etched is large. When the area to be etched is large, it is easy to detect when etching is ended. Therefore, the end of etching can be detected accurately, which makes it easy to shape wirings L1 and dummy patterns DP accurately.

Figure 14:
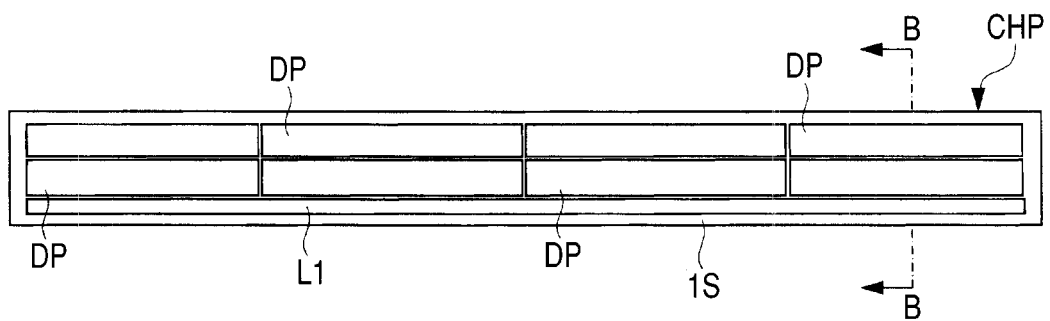
FIG. 14 shows that wirings and dummy patterns formed in the top wiring layer occupy 70% or more of the semiconductor chip area.
Figure 15:
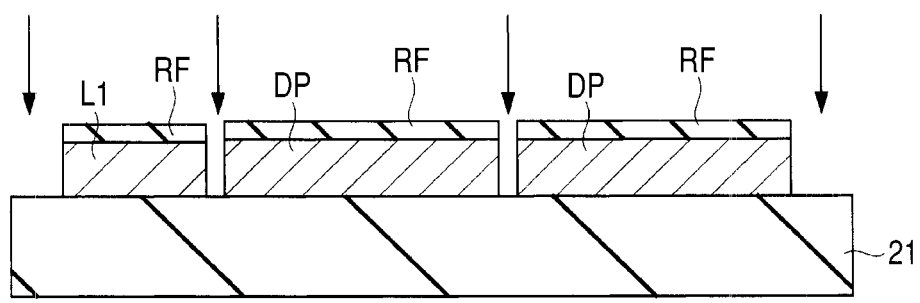
FIG. 15 is a sectional view taken along the line B-B in FIG. 14.

Next, an explanation will be given of a case that the wirings L1 and dummy patterns DP formed in the top wiring layer of the semiconductor chip CHP occupy 70% or more. FIG. 14 shows a case that the wirings L1 and dummy patterns DP formed in the top wiring layer of the semiconductor chip CHP occupy 70% or more. Namely, FIG. 14 shows a case that the ratio of dummy patterns DP in the top wiring layer is relatively high. FIG. 15 is a fragmentary sectional view taken along the line B-B in FIG. 14 showing a dummy pattern forming process.

As illustrated in FIG. 15, a conductive film, from which wirings L1 and dummy patterns DP are formed, lies over the silicon oxide film 21 as an interlayer insulation film and a patterned resist film RF is formed over the conductive film. Resist film patterning is done so that resist film is left in regions where wirings L1 and dummy patters DP are to be formed. Wirings L1 and dummy patterns DP are formed by etching the conductive film using the patterned resist film RF as a mask. When the ratio of dummy patterns DP is relatively high or 70% or more, the ratio of conductive film removed by etching is low. This means that the area to be etched is small. If the area to be etched is small, there is a problem that the end of etching cannot be detected accurately. This problem may arise in common etching equipment. In common etching equipment, accuracy in detection of the end of etching varies depending on the size of the area to be etched.

If the area to be etched is small and the end of etching cannot be detected accurately, defective wiring patterns L1 and defective dummy patterns DP may be produced due to under-etching or over-etching. One solution to this problem may be to detect the end of etching, not based on the actual etching condition but by controlling etching time. However, dimensional fluctuations in etching results cannot be properly avoided by control of etching time. For this reason, detection of the end of etching should be not by an indirect method such as control of etching time but based on the actual etching condition. Hence, for the purpose of increasing the accuracy in detecting the end of etching to improve the dummy pattern forming accuracy, dummy pattern regions DR as shown in FIG. 1 should not be formed all over the semiconductor chip CHP surface and the ratio of the area occupied by dummy patterns in the top wiring layer should be low.

Figure 16:
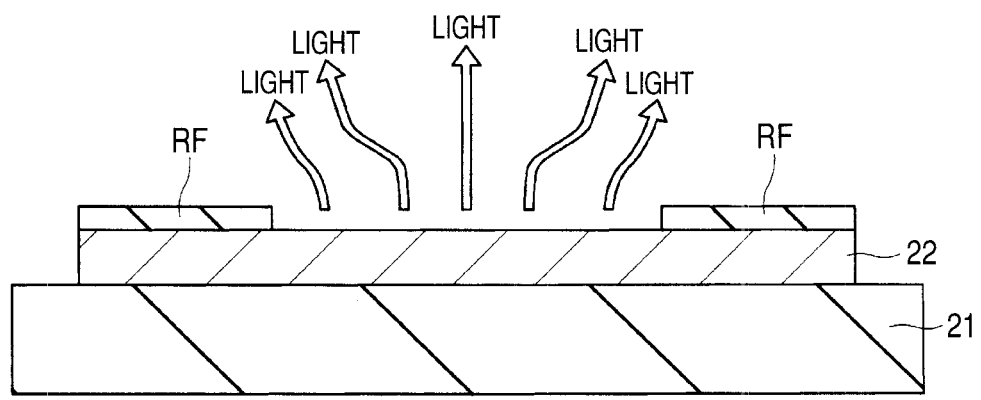
FIG. 16 illustrates the initial stage of etching where wirings and dummy patterns formed in the top wiring layer occupy less than 70% of the semiconductor chip area.

The second reason is further detailed below. FIG. 16 shows the process of etching the conductive film 22 formed over the silicon oxide film 21 to form wirings and dummy patterns which configure the top wiring layer. FIG. 16 shows a case that the ratio of the area occupied by dummy patterns is less than 70% or the etched area of the conductive film 22 is relatively large. For etching of the conductive film 22, chlorine gas such as $BCl_3$ or $Cl_3$ is used as an etching gas. Here, etching is done by chemical reaction between the chlorine gas and the aluminum film of the conductive film 22. In this process, as the reaction product evaporates, the aluminum film is gradually removed. When a sufficient amount of aluminum film exists, chemical reaction between the aluminum film and etching gas proceeds smoothly. Hence a large volume of reaction product is generated. The progress of aluminum film etching can be estimated by detecting light emission (plasma emission) from the reaction product. More specifically, at the initial stage of etching, a sufficient amount of aluminum exists and chemical reaction between the aluminum film and etching gas proceeds smoothly and a large volume of reaction product is generated. Therefore, at the initial stage of etching, a large quantity of light is emitted from the reaction product due to the presence of a large volume of reaction product.

Figure 17:
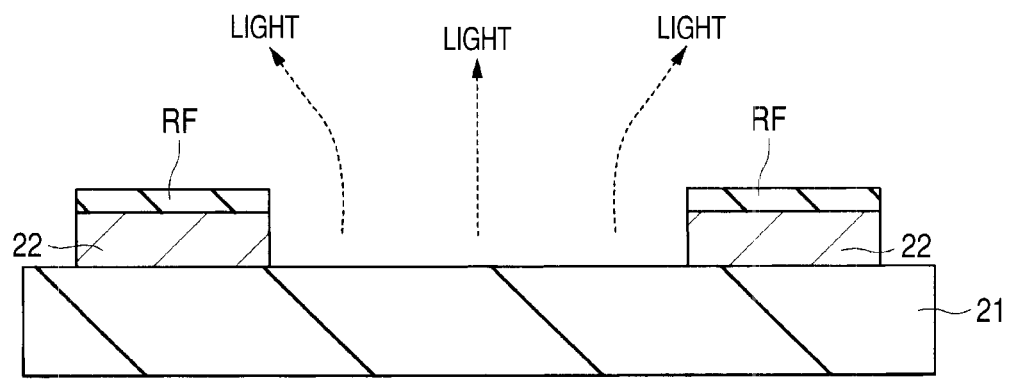
FIG. 17 illustrates the final stage of etching where wirings and dummy patterns formed in the top wiring layer occupy less than 70% of the semiconductor chip area.

FIG. 17 shows the final stage of etching where etching has been finished after the stage shown in FIG. 16. As illustrated in FIG. 17, patterning of the conductive film 22 has been almost finished and etching of the aluminum film of the conductive film 22 has been finished. At this time, since little aluminum film is left, chemical reaction between the aluminum film and etching gas is far less than in the initial stage shown in FIG. 16. Consequently the volume of reaction product from chemical reaction between the aluminum film and etching gas is small and the quantity of light emitted from the reaction product is also small. Namely the quantity of light emitted from the reaction product is small at the final stage of etching. Therefore, the end of etching can be detected by monitoring the quantity of light emitted from the reaction product in the etching process. When the quantity of light emitted from the reaction product becomes below a prescribed level, it may be decided that etching has been ended. If the etched area is large as shown in FIGS. 16 and 17, the difference in the intensity of light between the initial stage and final stage of etching is large and the end of etching can be detected accurately.

Figure 18:
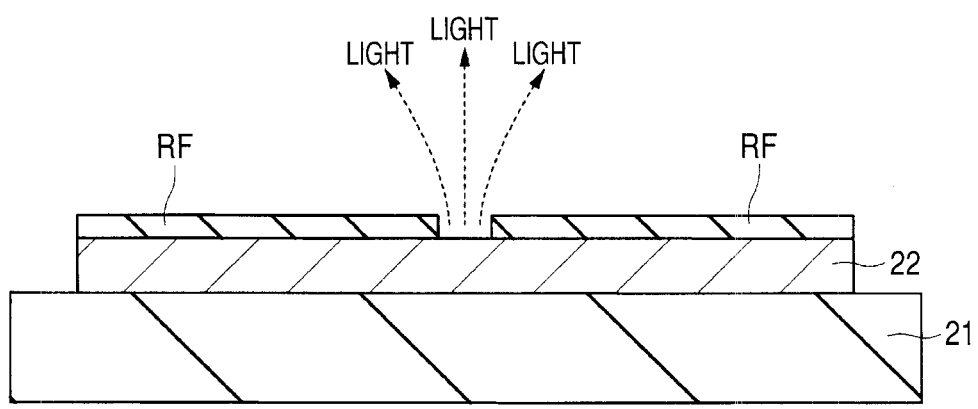
FIG. 18 illustrates the initial stage of etching where wirings and dummy patterns formed in the top wiring layer occupy 70% or more of the semiconductor chip area.

Next, FIG. 18 shows a case that the ratio of the area occupied by dummy patterns is 70% or more, or the area of the conductive film 22 to be etched is relatively small. In this case, as illustrated in FIG. 18, since the area to be etched is small, the intensity of emitted light is low even at the initial stage of etching. More specifically, at the initial stage of etching, a sufficient amount of conductive film is left but the area to be etched which is not covered by the resist film RF is very small; thus chemical reaction between the aluminum film and etching gas is less than when the ratio of the area occupied by dummy patterns is less than 70%. For the above reason, even at the initial stage of etching, the volume of reaction product is small and the intensity of light emitted from the reaction product is low.

Figure 19:
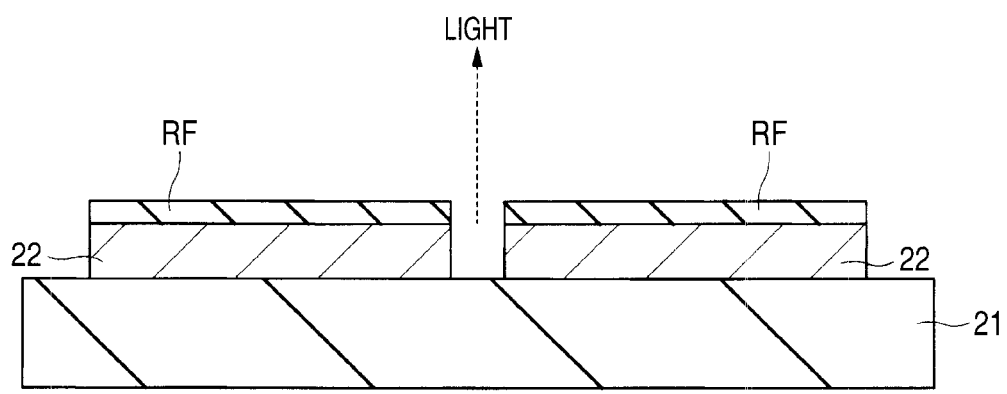
FIG. 19 illustrates the final stage of etching where wirings and dummy patterns formed in the top wiring layer occupy 70% or more of the semiconductor chip area.

Then, etching proceeds and comes to an end. FIG. 19 shows the final stage of etching where etching has been finished after the stage shown in FIG. 18. As illustrated in FIG. 19, almost all the aluminum film of the conductive film to be etched is removed and chemical reaction between the aluminum film and etching gas is less active and the volume of reaction product is small. Thus the intensity of light emitted from the reaction product is weak. When the ratio of the area occupied by dummy patterns is 70% or more as illustrated in FIGS. 18 and 19, the area to be etched is small and the volume of reaction product from etching is small even at the initial stage of etching and thus the quantity (intensity) of light is small (low). This means that when the ratio of the area occupied by dummy patterns is 70% or more, there is little difference in the intensity of light between the initial and final stages of etching. Hence, it is difficult to detect the end of etching accurately. If the end of etching is not detected accurately, there arises a problem that defective wiring patterns and defective dummy patterns may be produced due to under-etching or over-etching. For the above reason, it is desirable to avoid forming too many dummy patterns in the top wiring layer. In sum, for the purpose of increasing the accuracy in detecting the end of etching to improve the dummy pattern forming accuracy, dummy pattern regions DR as shown in FIG. 1 should not be formed all over the semiconductor chip CHP and the ratio of the area occupied by dummy patterns in the top wiring layer should be low.

The conductive film 22 is comprised of an aluminum film sandwiched by an upper titanium/titanium nitride film and a lower one. Usually, etching of the titanium/titanium nitride film is controlled according not to the emitted light intensity of reaction product but to etching time. Hence, if the end of etching of the aluminum film is detected accurately, the titanium/titanium nitride film can be removed properly in a prescribed etching time; on the other hand, if the end of its etching is not detected accurately, under-etching or over-etching of the aluminum film will occur, namely when etching is done for a prescribed time, under-etching or over-etching of the titanium/titanium nitride film may occur. This suggests that in order to process the conductive film 22 accurately, it is important to detect the end of etching accurately.

For the above reasons, the ratio of dummy pattern regions in the top wiring layer is limited to a value required to flatten bump electrodes. In other words, the disadvantages entailed by formation of too many dummy patterns in the top wiring layer are avoided.

The features of this embodiment are briefly summarized as follows. The first feature is to form dummy patterns in the top wiring layer and the second feature is to flatten the surface protection film covering the top wiring layer by CMP. Concretely dummy patterns are formed only beneath bump electrodes and in their peripheral regions or to the extent required to implement the first feature in order to eliminate level differences which would directly affect the flatness of bump electrodes.

The technical idea of this embodiment (first feature) is formation of dummy patterns in the top wiring layer. In ordinary semiconductor devices, dummy patterns are formed in an intermediate wiring layer of multilayer wiring layer. This is because another wiring layer must be made above the intermediate layer of the multilayer wiring layer and the intermediate layer must be flattened. However, the related art does not have the technical idea that dummy patterns are formed in the top wiring layer. Since there is no need to form a wiring layer above the top wiring layer, there is no idea that level differences caused by wirings in the top wiring layer must be reduced. Namely, there has been no need to flatten the top wiring layer accurately.

On the other hand, the semiconductor device in this embodiment is assumed to be an LCD driver. The LCD driver is characterized in that large bump electrodes are formed in the top wiring layer through the surface protection film. In this case, wirings are disposed beneath large bump electrodes for the effective use of the layer under the bump electrodes (top wiring layer). Thus wirings and space are formed in the top wiring layer beneath the bump electrodes and level differences between the wirings and space are generated. These level differences are reflected in the surface protection film covering the top wiring layer, resulting in irregularities in the surface of the surface protection film. Since the bump electrodes formed over the surface protection film are large, the surfaces of the bump electrodes are also irregular as a reflection of the irregular surface of the surface protection film. As a solution to this problem, in this embodiment, dummy patterns are formed in the top wiring layer to assure the surface flatness of bump electrodes (first feature). Therefore, the technical idea of the related art that dummy patterns are formed in an intermediate layer is different from that of this embodiment in terms of premises and objective. The related art, which just suggests formation of dummy patterns in an intermediate layer, does not include an idea which motivates those in the art to conceive of the first feature of this embodiment.

The second feature (technical idea) of this embodiment is to flatten the surface protection film covering the top wiring layer by CMP. The technique that the surface of an intermediate layer of the multilayer wiring layer is polished by CMP has been commonly used because there is need to flatten the interlayer insulation film in order to form another wiring layer over an intermediate layer. However, this related art does not include an idea that the surface protection film formed so as to cover the top wiring layer should be flattened. This is because there is no need to form an wiring layer over the surface protection film and thus there is no need to flatten the surface protection film.

On the other hand, the semiconductor device in this embodiment is assumed to be an LCD driver. The LCD driver is characterized in that large bump electrodes are formed in the top wiring layer through the surface protection film. In this case, wirings are disposed beneath large bump electrodes for the effective use of the layer under the bump electrodes (the top wiring layer). Thus wirings and space are formed in the top wiring layer beneath the bump electrodes and level differences between the wirings and space are generated. These level differences are reflected in the surface protection film covering the top wiring layer, resulting in irregularities in the surface of the surface protection film. Since the bump electrodes formed over the surface protection film are large, the surfaces of the bump electrodes are also irregular as a reflection of the irregular surface of the surface protection film. As a solution to this problem, in this embodiment, the surface of the surface protection film is flattened by CMP. Therefore, the technical idea of the related art that the interlayer insulation film surface is flattened by CMP is different from that of this embodiment in terms of premises and objective. The related art, which just suggests flattening of an intermediate layer by CMP, does not include an idea which motivates those in the art to conceive of the second feature of this embodiment.

The features of this embodiment have been described above. This embodiment is characteristic in the semiconductor chip's top wiring layer and its surface protection film lying over the top wiring layer. Wirings are formed in the layer under the top wiring layer of the semiconductor chip and a semiconductor element is formed over a semiconductor substrate under the wirings. The semiconductor chip in this embodiment is an LCD driver. The LCD driver has the function of converting input signals (serial data) into output signals (parallel data) and the function as a level shift circuit which changes the voltage value inside the LCD driver to apply a specified level of voltage to liquid crystal display elements (pixels). These LCD driver functions are performed by CMISFETs (Complementary Metal Insulator Semiconductor Field Effect Transistors) formed in the semiconductor chip. There are two types of CMISFETs for use in the LCD driver: low-voltage MISFETs which operate at a relatively low voltage and high-voltage MISFETs which operate at a relatively high voltage. Next, a CMISFET and its first wiring layer will be described.

Figure 20:
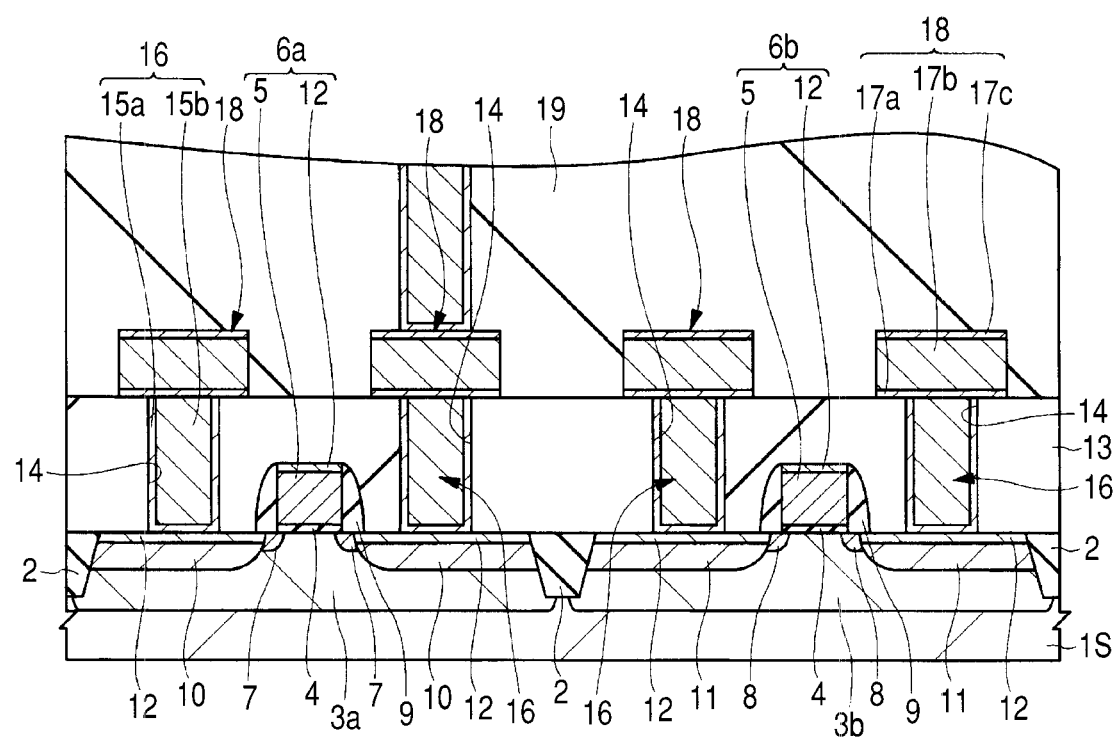
FIG. 20 is a sectional view of a MISFET formed in a semiconductor chip.

FIG. 20 is a sectional view of a CMISFET formed in a semiconductor chip in this embodiment. As illustrated in FIG. 20, element isolation regions 2 are formed in the surface of a silicon monocrystal semiconductor substrate 1S. Active regions which configure a semiconductor element are separated by an element isolation region 2. Among active regions separated by element isolation regions 2, a p-type well 3a is formed in an n-channel MISFET formation region and an n-type well 3b is formed in a p-channel MISFET formation region.

An n-channel MISFET is formed over the p-type well 3a and a p-channel MISFET is formed over the n-type well 3b. First, the n-channel MISFET is described. The n-channel MISFET has a gate insulation film 4 over the p-type well 3a and a gate electrode 6a is formed over the gate insulation film 4. The gate electrode 6a is a laminate comprised of a polysilicon film 5 and a cobalt silicide film 12 formed over the polysilicon film 5. The cobalt silicide film 12 is formed in order to decrease the resistance of the gate electrode 6a.

Side walls 9 are formed on both sides of the gate electrode 6a and a shallow low-concentration n-type impurity diffusion region 7 is formed in the semiconductor substrate 1S just beneath each side wall 9. This shallow low-concentration n-type impurity diffusion region 7 is a semiconductor region in which n-type impurities such as phosphor and arsenic are introduced in the semiconductor substrate 1S and it is formed in a way to match the gate electrode 6a. In the semiconductor substrate 1S, a deep high-concentration n-type impurity diffusion region 10 is formed outside the shallow low-concentration n-type impurity diffusion region 7. This deep high-concentration n-type impurity diffusion region 10 is also a semiconductor region in which n-type impurities such as phosphor and arsenic are introduced in the semiconductor substrate 1S and it is formed in a way to match the side wall 9.

The shallow low-concentration n-type impurity diffusion region 7 and deep high-concentration n-type impurity diffusion region 10 configure a source region and a drain region for an n-channel MISFET. When a shallow low-concentration n-type impurity diffusion region 7 and a deep high-concentration n-type impurity diffusion region 10 are formed for each of the source region and drain region in this way, the source and drain regions have a lightly doped drain (LDD) structure, thereby preventing electric field concentration under an end of the gate electrode 6a. The cobalt silicide film 12 is formed over the surface of the deep high-concentration n-type impurity diffusion region 10. The cobalt silicide film 12 is formed in order to decrease the resistance of the source and drain regions.

Next, the p-channel MISFET is described. The p-channel MISFET has a gate insulation film 4 over the n-type well 3b and a gate electrode 6b is formed over the gate insulation film 4. The gate electrode 6b is a laminate comprised of a polysilicon film 5 and a cobalt silicide film 12 formed over the polysilicon film 5. The cobalt silicide film 12 is formed in order to decrease the resistance of the gate electrode 6b.

Side walls 9 are formed on both sides of the gate electrode 6b and a shallow low-concentration p-type impurity diffusion region 8 is formed in the semiconductor substrate 1S just beneath each side wall 9. This shallow low-concentration p-type impurity diffusion region 8 is a semiconductor region in which p-type impurities such as boron are introduced in the semiconductor substrate 1S and it is formed in a way to match the gate electrode 6b. In the semiconductor substrate 1S, a deep high-concentration p-type impurity diffusion region 11 is formed outside the shallow low-concentration p-type impurity diffusion region 8. This deep high-concentration p-type impurity diffusion region 11 is also a semiconductor region in which p-type impurities such as boron are introduced in the semiconductor substrate 1S and it is formed in a way to match the side wall 9.

The shallow low-concentration p-type impurity diffusion region 8 and deep high-concentration p-type impurity diffusion region 11 form a source region and a drain region for a p-channel MISFET. When a shallow low-concentration p-type impurity diffusion region 8 and a deep high-concentration p-type impurity diffusion region 11 are formed for each of the source region and drain region in this way, the source and drain regions have a lightly doped drain (LDD) structure, thereby preventing electric field concentration under an end of the gate electrode 6b. The cobalt silicide film 12 is formed over the surface of the deep high-concentration p-type impurity diffusion region 11. The cobalt silicide film 12 is formed in order to decrease the resistance of the source and drain regions.

Next, a wiring structure for coupling with the CMISFET will be described. An interlayer insulation film 13 (silicon oxide film) is formed over the CMISFET so as to cover the CMISFET. A contact hole 14 is made in the interlayer insulation film 13 so as to penetrate the interlayer insulation film 13 and reach the cobalt silicide film 12 in which the source and drain regions are formed. Inside the contact hole 14, a titanium/titanium nitride film 15a as a barrier conductive film is formed and a tungsten film 15b is buried in the contact hole 14. A conductive plug 16 is produced by burying the titanium/titanium nitride film 15a and tungsten film 15b in the contact hole 14 in this way. Wiring 18 is formed over the interlayer insulation film 13 and this wiring 18 and the plug 16 are electrically coupled. The wiring 18 is, for example, a laminate comprised of a titanium/titanium nitride film 17a, an aluminum film 17b and a titanium/titanium nitride film 17c. An interlayer insulation film 19 is formed over the wiring 18.

Furthermore, a multilayer wiring layer is formed over the interlayer insulation film 19 and the above-mentioned top wiring layer is formed at its top. What is formed over the top wiring layer is shown in FIGS. 5 and 6. The semiconductor device (LCD driver) in this embodiment is structured as described above.

Next, how the CMISFET thus structured in this embodiment operates will be briefly explained. The n-channel MISFET is taken as an example to explain operation of the CMISFET. First, how the n-channel MISFET is turned ON is explained. As a prescribed voltage above a threshold is applied to the gate electrode 6a, a channel as an n-type semiconductor region is formed in the surface of the semiconductor substrate 1S (p-type well 3a) just beneath the gate electrode 6a. Here, since the source region and drain region are n-type semiconductor regions, the source region and drain region are electrically coupled through the channel. Therefore, when a difference in potential between the source and drain regions is given, an electric current flows between the source and drain regions. This turns ON the n-channel MISFET.

Next, how the n-channel MISFET is turned OFF is explained. As a prescribed voltage below the threshold is applied to the gate electrode 6a, the channel formed in the surface of the semiconductor substrate 1S (p-type well 3a) beneath the gate electrode 6a disappears. As the channel disappears, the source region and drain region which have been electrically coupled through the channel are electrically isolated form each other. Therefore, an electric current ceases to flow between the source and drain regions. This turns OFF the n-channel MISFET. By turning ON and OFF the n-channel MISFET in this way, the integrated circuit of the LCD driver operates in a prescribed manner.

Figure 21:
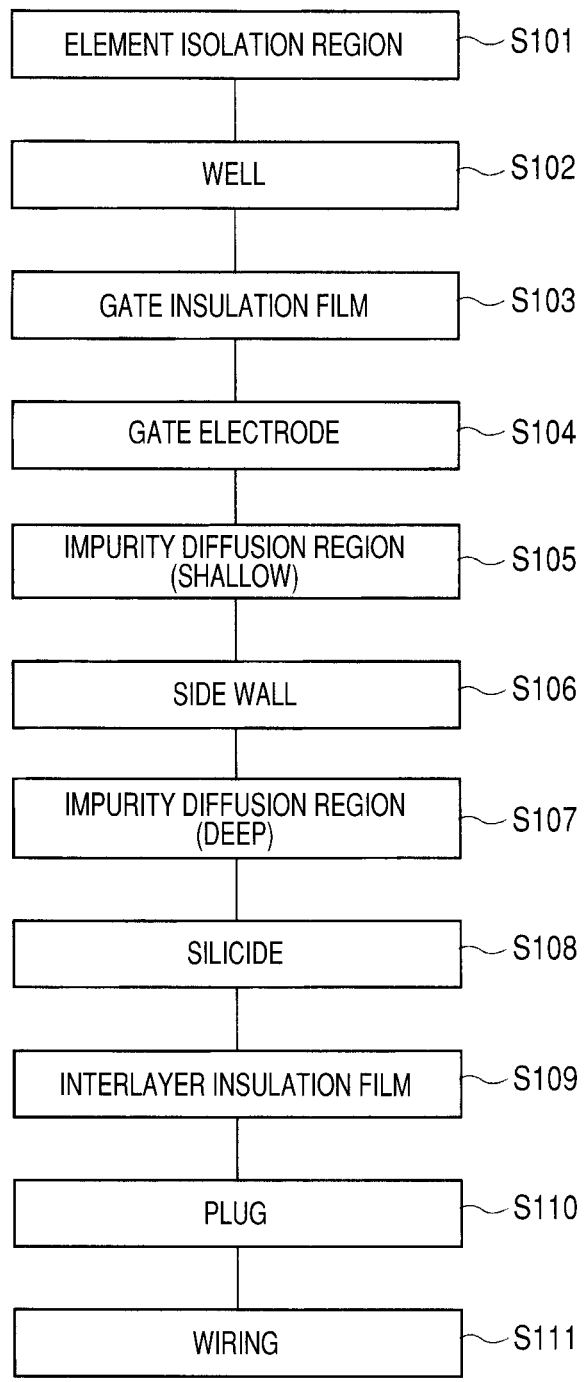
FIG. 21 is a flowchart showing the sequence of manufacturing a MISFET.

Next, a method of manufacturing a semiconductor device (LCD driver) according to this embodiment will be described referring to drawings. FIG. 21 is a flowchart showing the sequence of manufacturing a CMISFET. First, the process of forming a CMISFET and a first wiring layer will be described referring to FIGS. 20 and 21.

First of all, a silicon monocrystal semiconductor substrate 1S doped with p-type impurities such as boron (B) is prepared. At this moment, the semiconductor substrate 1S is a virtually disc-shaped semiconductor wafer. Then, element isolation regions 2 are formed in the CMISFET formation region of the semiconductor substrate 1S (S101). The element isolation regions 2 are intended to prevent elements from interfering with each other. The element isolation regions 2 can be formed, for example, using the LOCOS (local oxidation of silicon) or STI (shallow trench isolation) method. In the case of using the STI method, an element isolation region 2 is formed as follows. An element isolation trench is made by photolithography and etching. Then, a silicon oxide film is formed over the semiconductor substrate 1S so as to fill the element isolation trench and unwanted silicon oxide film over the semiconductor substrate 1S is removed by chemical mechanical polishing (CMP). Thus an element isolation region 2 with silicon oxide film buried only in the element isolation trench is created.

Next, wells are formed by introducing impurities in active regions isolated by element isolation regions (S102). For instance, a p-type well 3a is formed in an n-channel MISFET formation region as an active region and an n-type well 3b is formed in a p-channel MISFET formation region as an active region. The p-type well 3a is formed by introducing p-type impurities such as boron by ion implantation. Similarly the n-type well 3b is formed by introducing n-type impurities such as phosphor (P) or arsenic (As) by ion implantation.

Next, semiconductor regions for channels (not shown) are formed over the surfaces of the p-type well and n-type well. The semiconductor regions for channels are intended to control the threshold for channel formation.

Next, a gate insulation film 4 is formed over the semiconductor substrate 1S (S103). The gate insulation film 4 is, for example, a silicon oxide film which can be made by thermal oxidation or a similar technique. The material of the gate insulation film 4 is not limited to silicon oxide but may be one among other various materials such as silicon oxynitride (SiON). It may be nitride precipitation in the interface between the gate insulation film 4 and semiconductor substrate 1S. The silicon oxynitride film is more effective in decreasing the interface state density and reducing electron traps than the silicon oxide film. Therefore, it increases the hot carrier reliability of the gate insulation film 4 and enhances the dielectric strength. In addition, the silicon oxynitride film is less easy for impurities to penetrate than the silicon oxide film. Hence, the use of silicon oxynitride film for the gate insulation film 4 minimizes threshold voltage fluctuations caused by diffusion of impurities in the gate electrode into the semiconductor substrate. The silicon oxynitride film can be formed, for example, by heat treatment of the semiconductor substrate 1S in a nitrogen gas atmosphere containing NO, $NO_2$ or $NH_3$. A similar effect can be achieved by forming a gate insulation film 4 of silicon oxide over the surface of the semiconductor substrate 1S, and then thermally treating the semiconductor substrate 1S in a nitrogen gas atmosphere to induce nitrogen precipitation in the interface between the gate insulation film 4 and semiconductor substrate 1S.

Alternatively, the gate insulation film 4 may be a high dielectric constant film which has a higher dielectric constant than the silicon oxide film. In the past, the silicon oxide film has been used for the gate insulation film 4 for the reason that it provides high dielectric strength and the interface between silicon and silicon oxide is electrically and physically stable. However, with the growing tendency toward microscopic devices, a very thin gate insulation film 4 is in demand. If a very thin silicon oxide film is used for the gate insulation film 4, a so-called tunnel current may be generated where electrons flowing in a MISFET channel flow to the gate electrode through a barrier formed by the silicon oxide film.

For this reason, there is a growing tendency to use a material with a higher dielectric constant than silicon oxide which can be thicker while it provides the same capacitance. Since a high dielectric constant film can provide the same capacitance even when it is thicker, leak currents can be reduced.

For instance, a hafnium oxide ($HfO_2$) film is used as a high dielectric constant film in this case. Instead of hafnium oxide films, other hafnium films such as hafnium aluminate film, HfON film (hafnium oxynitride film), HfSiO film (hafnium silicate film), HfSiON film (hafnium silicon oxynitride film) and HfAlO film may be used. Furthermore, these hafnium insulation materials may be combined with other various oxides such as tantalum oxide, niobium oxide, titanium oxide, zirconium oxide, lanthanum oxide, and yttrium oxide to prepare hafnium insulation films. Since these hafnium insulation films provide a higher dielectric constant than silicon oxide films like hafnium oxide films and silicon oxynitride films, they achieve the same effects as when hafnium oxide films are used.

Next, a polysilicon film 5 is formed over the gate insulation film 4. The polysilicon film 5 can be formed by CVD or a similar technique. Then, n-type impurities such as phosphor or arsenic are introduced into the polysilicon film 5 formed in the n-channel MISFET formation region by photolithography and ion implantation. Similarly, p-type impurities such as boron are introduced into the polysilicon film 5 formed in the p-channel MISFET formation region.

Next, the polysilicon film 5 is etched using the patterned resist film as a mask to form a gate electrode 6a in the n-channel MISFET formation region and form a gate electrode 6b in the p-channel MISFET formation region (S104).

Here, n-type impurities are introduced into the polysilicon film 5 of the gate electrode 6a in the n-channel MISFET formation region. Hence, the work function value of the gate electrode 6a can be a value near silicon's conduction band (4.15 eV) and the threshold voltage for the n-channel MISFET can be decreased. On the other hand, p-type impurities are introduced into the polysilicon film 5 of the gate electrode 6b in the p-channel MISFET formation region. Hence, the work function value of the gate electrode 6b can be a value near silicon's valence band (5.15 eV) and the threshold voltage for the p-channel MISFET can be decreased. In this way, in this embodiment 1, the threshold voltages for both the n-channel MISFET and p-channel MISFET can be decreased (dual gate structure).

Next, a shallow low-concentration n-type impurity diffusion region 7 which matches the gate electrode 6a of the n-channel MISFET is formed by photolithography and ion implantation. The shallow low-concentration n-type impurity diffusion region 7 is a semiconductor region. Similarly a shallow low-concentration p-type impurity diffusion region 8 is formed in the p-channel MISFET formation region. The shallow low-concentration p-type impurity diffusion region 8 is formed so as to match the gate electrode 6b of the p-channel MISFET. The shallow low-concentration p-type impurity diffusion region 8 can be formed by photolithography and ion implantation (S105).

Next, a silicon oxide film is formed over the semiconductor substrate 1S. The silicon oxide film can be formed by CVD or a similar technique. By anisotropic etching of the silicon oxide film, side walls 9 are formed as side walls of the gate electrodes 6a and 6b (S106). Although a single layer film of silicon oxide is used to form the side walls 9, the side walls 9 are not limited thereto and a laminate comprised of silicon nitride and silicon oxide films may also be used for the side walls.

Then, a deep high-concentration n-type impurity diffusion region 10 which matches the side walls 9 is formed in the n-channel MISFET formation region by photolithography and ion implantation (S107). The deep high-concentration n-type impurity diffusion region 10 is a semiconductor region. The deep high-concentration n-type impurity diffusion region 10 and the shallow low-concentration n-type impurity diffusion region 7 configure a source region. Similarly the deep high-concentration n-type impurity diffusion region 10 and the shallow low-concentration n-type impurity diffusion region 7 configure a drain region. When the source region and drain region are each comprised of a shallow n-type impurity diffusion region and a deep n-type impurity diffusion region in this way, the source and drain regions have a LDD (Lightly Doped Drain) structure.

Similarly a deep high-concentration p-type impurity diffusion region 11 which matches the side walls 9 is formed in the p-channel MISFET formation region. The deep high-concentration p-type impurity diffusion region 11 and the shallow low-concentration p-type impurity diffusion region 8 configure a source region and a drain region. Therefore, in the p-channel MISFET as well, the source and drain regions have an LDD structure.

After deep high-concentration n-type impurity diffusion regions 10 and deep high-concentration p-type impurity diffusion regions 11 are thus formed, heat treatment is made at 1000° C. or so to activate the introduced impurities.

After that, a cobalt film is formed over the semiconductor substrate in a way that it directly contacts the gate electrodes 6a and 6b. Likewise, the cobalt film directly contacts the deep high-concentration n-type impurity diffusion regions 10 and deep high-concentration p-type impurity diffusion regions 11.

The cobalt film can be made by sputtering or a similar technique. By heat treatment after formation of the cobalt film, reaction between the polysilicon film 5 of the gate electrode 6a (6b) and the cobalt film is induced to form a cobalt silicide film 12 (S108). Consequently the gate electrode 6a (6b) becomes a laminate comprised of the polysilicon film 5 and cobalt silicide film 12. The cobalt silicide film 12 is intended to decrease the resistance of the gate electrode. Likewise, heat treatment as mentioned above induces reaction between the silicon and the cobalt film in the surface of each of the deep high-concentration n-type impurity diffusion regions 10 and deep high-concentration p-type impurity diffusion regions 11 to form a cobalt silicide film 12. Therefore, the resistance is also decreased in the deep high-concentration n-type impurity diffusion regions 10 and deep high-concentration p-type impurity diffusion regions 11.

The unreacted cobalt is removed from the semiconductor substrate 1S. It is also possible to form a nickel silicide film or titanium silicide film instead of the cobalt silicide film 12 in this embodiment 1.

Next, a silicon oxide film for an interlayer insulation film 13 is formed over the main surface of the semiconductor substrate 1S (S109). This silicon oxide film can be formed by CVD (chemical vapor deposition), using, for example, TEOS (Tetra Ethyl Ortho Silicate) as its material. Then, the surface of the silicon oxide film is flattened by CMP or a similar technique.

Next, a contact hole 14 is made in the silicon oxide film by photolithography and etching. Then, a titanium/titanium nitride film 15a is formed on the silicon oxide film of the contact hole 14 including its bottom and inner wall. The titanium/titanium nitride film 15a is a laminate comprised of a titanium film and a titanium nitride film and can be formed by sputtering or a similar technique. The titanium/titanium nitride film 15a functions as a barrier to prevent the tungsten, the material for the film to be buried at a next step, from diffusing into the silicon.

Next, a tungsten film 15b is formed all over the main surface of the semiconductor substrate 1S in a way to fill the contact hole 14. This tungsten film 15b can be formed by CVD or a similar technique. A plug 16 is formed by removing unwanted parts of the titanium/titanium nitride film 15a and tungsten film 15b over the silicon oxide film by CMP or a similar technique (S110).

Next, a titanium/titanium nitride film 17a, an aluminum film 17b containing copper, and a titanium/titanium nitride film 17c are formed over the silicon oxide film and plug 16 successively. These films can be formed by sputtering or a similar technique. Then, these films are patterned by photolithography and etching to form wiring 18 (S111). Furthermore, wiring is formed over the wiring to form a multilayer wiring. The multilayer wiring is formed over the semiconductor substrate 1S in this way.

Figure 22:
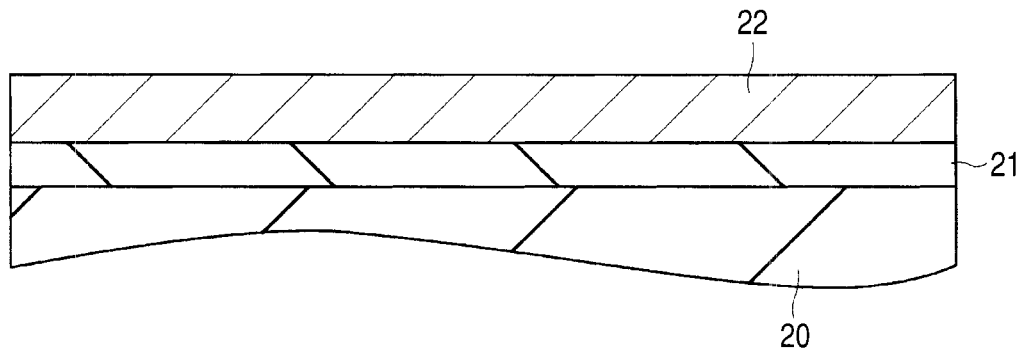
FIG. 22 is a sectional view showing a step in the process of manufacturing a semiconductor device in an embodiment.

Next, steps which follow the process of forming the top wiring layer of the multilayer wiring layer will be described referring to drawings. As illustrated in FIG. 22, first, an interlayer insulation film is formed. The interlayer insulation film is a laminate comprised of a silicon oxide film 20 and a silicon oxide film 21. The silicon oxide film 20 can be formed by plasma CVD (Chemical Vapor Deposition) or a similar technique. For the silicon oxide film 21, TEOS is used as the material.

Figure 23:
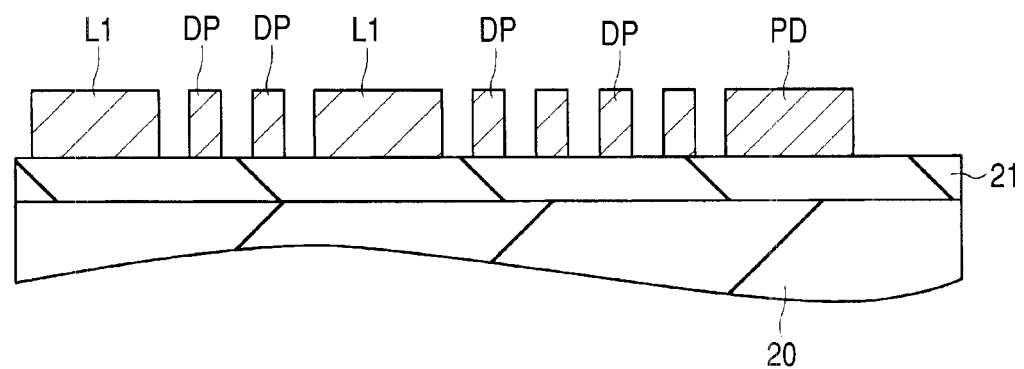
FIG. 23 is a sectional view showing a semiconductor device manufacturing step following the step shown in FIG. 22.

Next, a conductive film 22 is formed over the silicon oxide film 21. The conductive film is, for example, an aluminum film which can be formed by sputtering or a similar technique. Actually in the conductive film 22, the aluminum film is sandwiched between an upper titanium/titanium nitride film and a lower one. As illustrated in FIG. 23, the conductive film 22 is processed by photolithography and etching. By processing the conductive film 22, a top wiring layer is formed over the silicon oxide film 21. For example, the top wiring layer includes pads PD, wirings L1, and dummy patterns DP. Dummy patterns DP are formed in the space between wirings L1. The dummy patterns DP, which lie in the same layer as the wirings L1, reduce the level difference between the wirings L1 and space.

Figure 24:
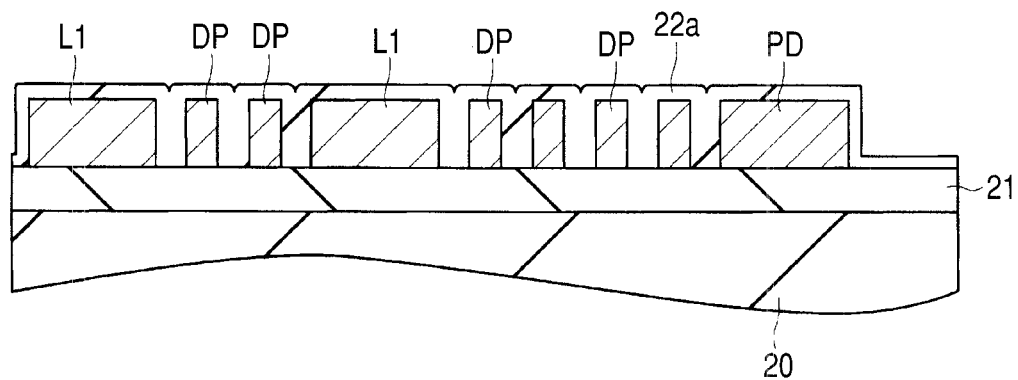
FIG. 24 is a sectional view showing a semiconductor device manufacturing step following the step shown in FIG. 23.

Next, as shown in FIG. 24, a silicon oxide film 22a which covers the top wiring layer is formed. The silicon oxide film 22a can be formed by plasma CVD or a similar technique. The dummy patterns DP, which are formed in the top wiring layer so as to fill the space between wirings L1, reduce irregularities which reflect the irregular surface of the silicon oxide film 22a. In other words, since the dummy patterns DP fill the space between wirings L1, surface irregularities of the silicon oxide film 22a are reduced.

Figure 25:
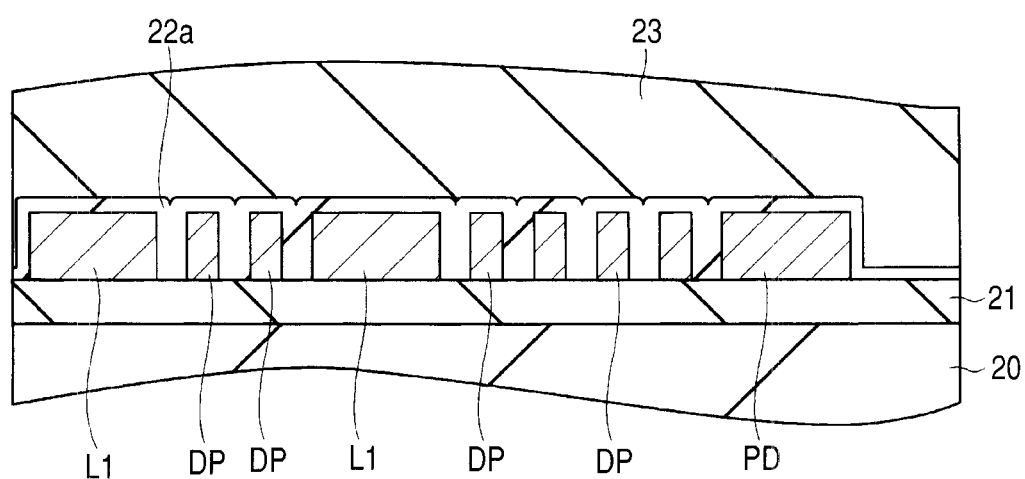
FIG. 25 is a sectional view showing a semiconductor device manufacturing step following the step shown in FIG. 24.
Figure 26:
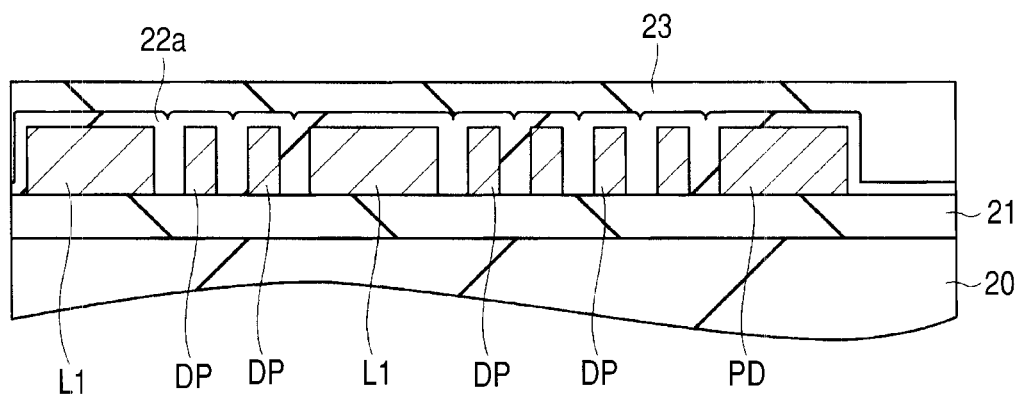
FIG. 26 is a sectional view showing a semiconductor device manufacturing step following the step shown in FIG. 25.

Then, as illustrated in FIG. 25, a silicon oxide film 23 is formed over the silicon oxide film 22a. For example, the silicon oxide film 23 can be formed using TEOS as its material by CVD. Then, as illustrated in FIG. 26, the surface of the silicon oxide film 23 is flattened by CMP (chemical mechanical polishing) or a similar technique. CMP is a polishing technique in which the semiconductor substrate surface is pressed against an abrasive pad while an abrasive liquid (slurry) containing silica particles flows on the semiconductor substrate. The technique uses both a chemical mechanism to oxide the surface of the material to be polished with a slurry and a mechanical mechanism to chip off the oxidized layer mechanically.

The silicon oxide film 22a which underlies the silicon oxide film 23 has a less irregular surface thanks to the dummy patterns DP. Therefore, the silicon oxide film 23 formed over the silicon oxide film 22a also has a less irregular surface. The process of polishing the silicon oxide film 23 (by CMP) to flatten its surface is relatively easy because the silicon oxide film 23 has a less irregular surface. Namely, formation of dummy patterns DP in the top wiring layer makes it easy to flatten the silicon oxide film 23 at a later step.

Figure 27:
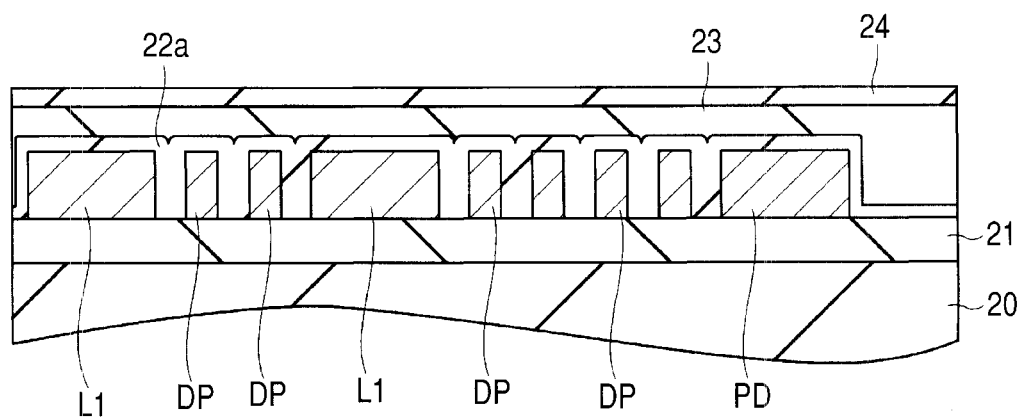
FIG. 27 is a sectional view showing a semiconductor device manufacturing step following the step shown in FIG. 26.

Next, as illustrated in FIG. 27, a silicon nitride film 24 is formed over the silicon oxide film 23. The silicon nitride film 24 can be formed by plasma CVD or a similar technique. A surface protection film comprised of the silicon oxide film 22a, silicon oxide film 23 and silicon nitride film 24 is thus formed over the top wiring layer.

Figure 28:
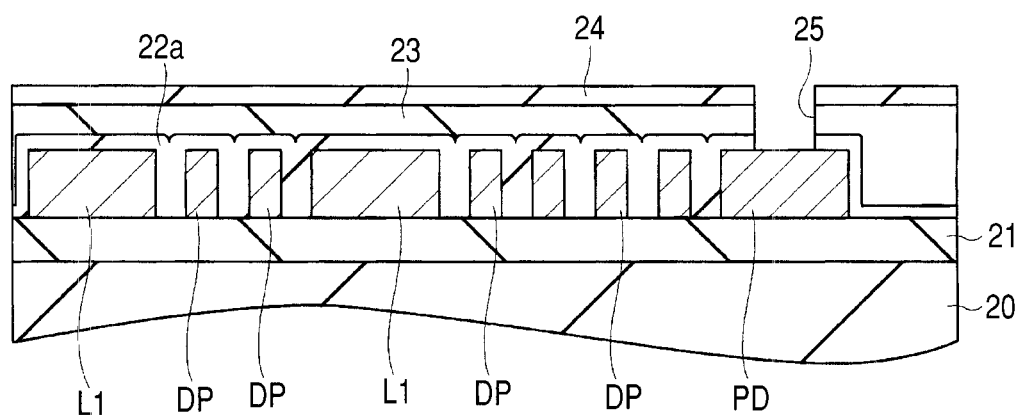
FIG. 28 is a sectional view showing a semiconductor device manufacturing step following the step shown in FIG. 27.

Next, as illustrated in FIG. 28, an opening 25 is made in the surface protection film by photolithography and etching. This opening 25 is formed over a pad PD to expose the pad PD surface. The size of the opening is smaller than that of the pad PD.

Figure 29:
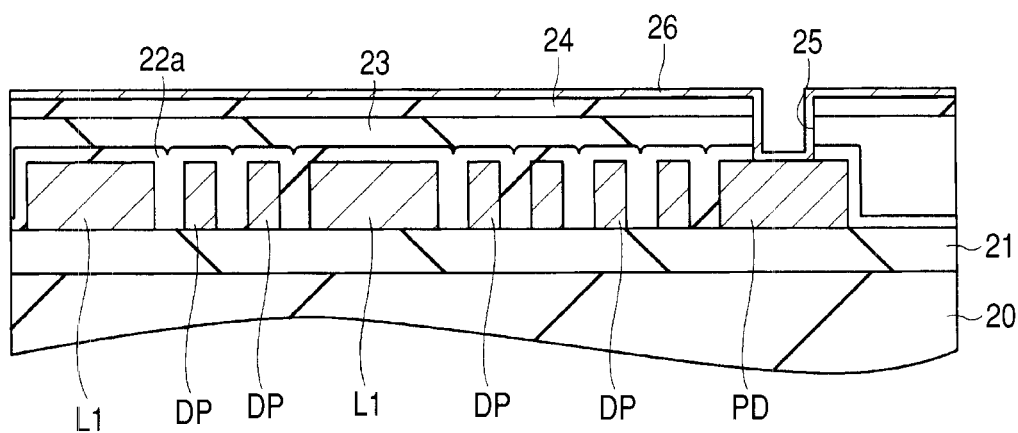
FIG. 29 is a sectional view showing a semiconductor device manufacturing step following the step shown in FIG. 28.

Next, as illustrated in FIG. 29, a UBM film (Under Bump Metal) film 26 is formed over the surface protection film including the inside of the opening 25. The UBM film 26 can be formed by sputtering or a similar technique. The UBM film 26 is a single layer film or laminated film including a titanium film, nickel film, palladium film, titanium-tungsten alloy film, titanium nitride film and/or gold film. The UBM film 26 has not only the function to improve adhesion of bump electrodes to pads and the surface protection film but also the barrier function to suppress or prevent movement of metal elements of the gold film formed at a later step to wirings L1, etc. or movement of metal elements of wirings L1, etc. to the gold film.

Figure 30:
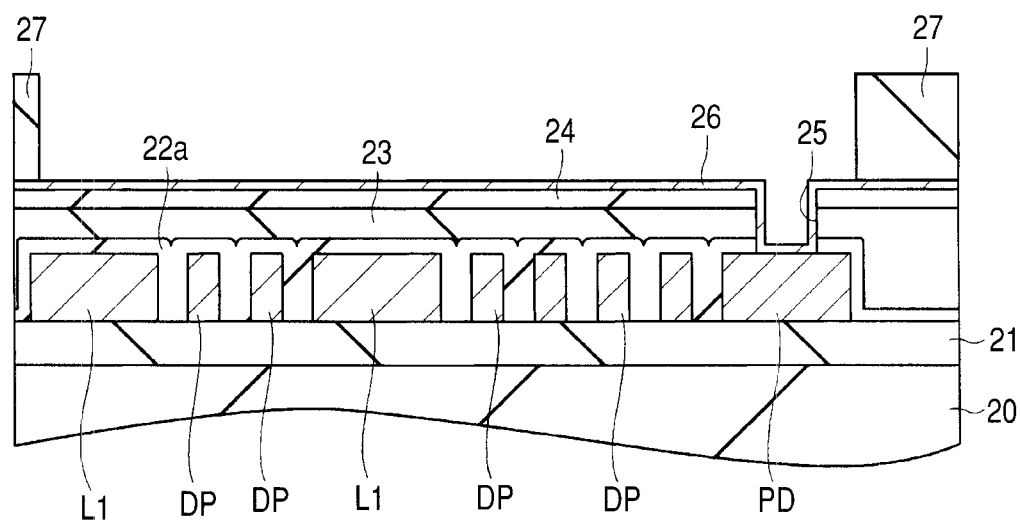
FIG. 30 is a sectional view showing a semiconductor device manufacturing step following the step shown in FIG. 29.
Figure 31:
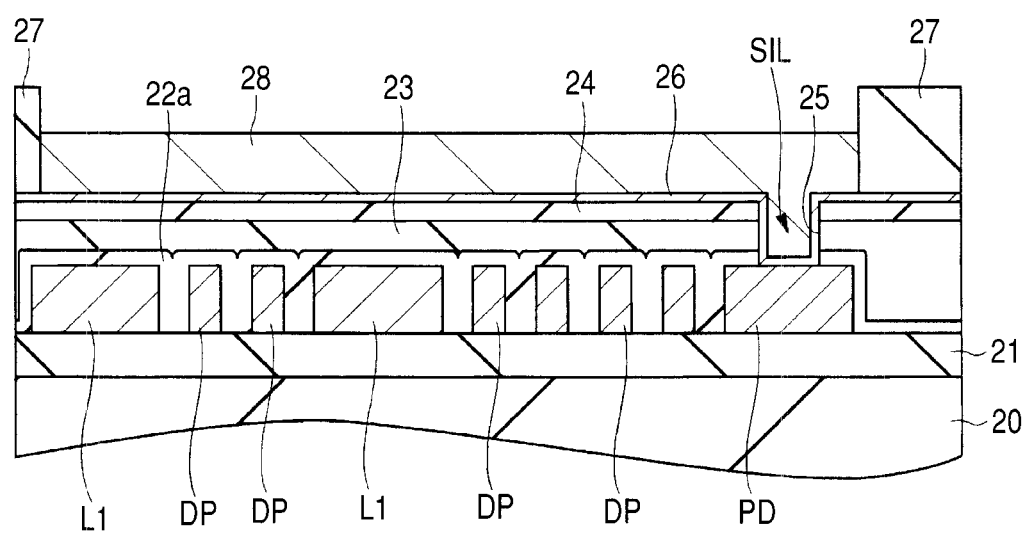
FIG. 31 is a sectional view showing a semiconductor device manufacturing step following the step shown in FIG. 30.

Next, as illustrated in FIG. 30, after a resist film 27 is coated on the UBM film 26, patterning is done on the resist film 27 by light exposure and development. Patterning must be done so as not to leave the resist film 27 in bump electrode formation regions. Then, as illustrated in FIG. 31, a gold film 28 is formed by plating. The gold film 28 lies over the surface protection film (silicon nitride film 24) and is also buried in the opening 25. When the gold film 28 is buried in the opening 25, a plug SIL is completed.

Figure 32:
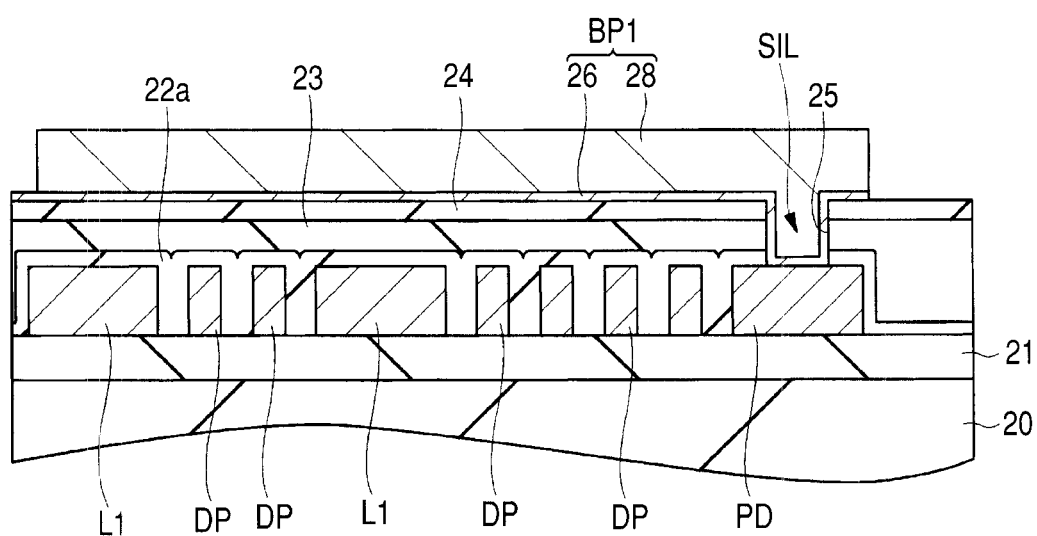
FIG. 32 is a sectional view showing a semiconductor device manufacturing step following the step shown in FIG. 31.

Then, as illustrated in FIG. 32, a bump electrode BP1, comprised of the gold film 28 and UBM film 26, is formed by removing the patterned resist film 27 and the UBM film 26 covered by the resist film 27. The bump electrode BP1 is larger than the pad PD and wirings L1 lie in the top wiring layer beneath the bump electrode BP1. The presence of wirings L1 beneath the bump electrode BP1 permits effective use of the space beneath the bump electrode, leading to a smaller semiconductor device. In addition, when dummy patterns DP lie beneath the bump electrode BP1 in addition to wirings L1 as power lines or signal lines, the flatness of the surface protection film formed over the top wiring layer is increased. In other words, if only power lines and signal lines (wirings L1) are formed in the top layer of the multilayer wiring layer, surface irregularities caused by the power lines and signal lines (wirings L1) would be serious because the top wiring layer cannot be densely filled with wirings. By forming dummy patterns DP as well as wirings in the layer, the flatness of the top wiring layer is increased. Furthermore, since the surface of the surface protection film is flattened by CMP, the flatness of the surface protection film formed over the top wiring layer is guaranteed and the flatness of bump electrodes formed over the surface protection film is increased. After that, individual semiconductor chips are obtained by dicing the semiconductor substrate.

Figure 33:
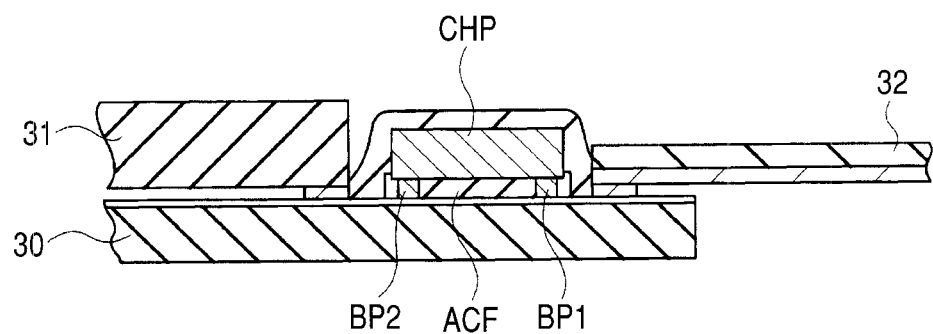
FIG. 33 is a sectional view showing that a semiconductor chip is mounted on a glass substrate in an embodiment.

Next, a semiconductor chip obtained by the above process is mounted on a mounting substrate by bonding. FIG. 33 shows that a semiconductor chip CHP is mounted on a glass substrate 30 (COG: Chip On Glass). As illustrated in FIG. 33, a glass substrate 31 is mounted on the glass substrate 30, thereby forming an LCD screen. The semiconductor chip CHP, an LCD driver, is mounted on the glass substrate 30 near the LCD screen. Bump electrodes BP1 and BP2 are formed in the semiconductor chip CHP and the bump electrodes BP1 and BP2 are coupled with terminals formed over the glass substrate 30 through ACF (Anisotropic Conductive Film). The glass substrate 30 and a flexible printed circuit board 32 are also coupled through ACF. In the semiconductor chip CHP mounted on the glass substrate 30, the bump electrode BP2 for output signals is electrically coupled with the LCD screen and the bump electrode BP1 for input signals is coupled with the flexible printed circuit board 32.

Figure 34:
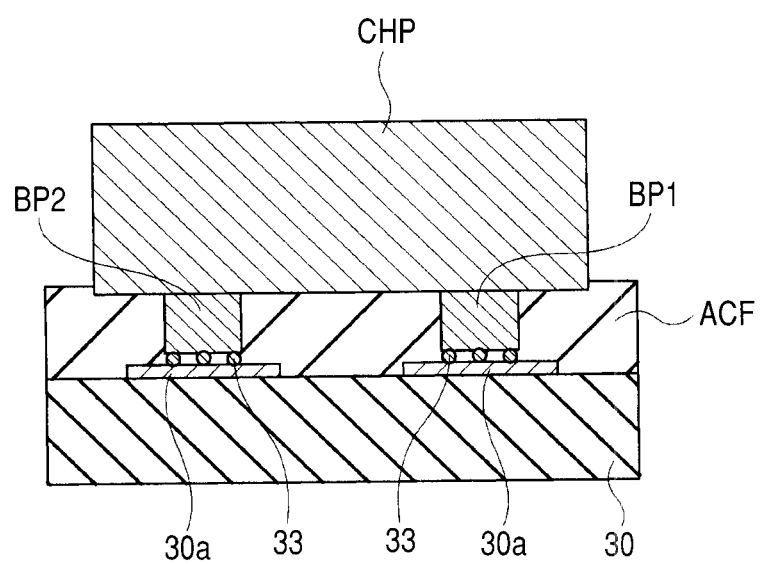
FIG. 34 is an enlarged view showing that the semiconductor chip and glass substrate are coupled through an anisotropic conductive film.

FIG. 34 shows the semiconductor chip CHP mounted on the glass substrate 30 in an enlarged form. As illustrated in FIG. 34, terminals 30a are formed over the glass substrate 30 and these terminals 30a are electrically coupled with the bump electrodes BP1 and BP2. The bump electrodes BP1 and BP2 and the terminals 30a are not in direct contact with each other but coupled through ACF. The ACF is a film made by mixing conductive fine metal particles 33 with thermosetting resin and shaping the mixture into a membrane. Each of the metal particles 33 is a spherical body with a diameter of 3-5 μm which is comprised of a nickel layer and a gold coating layer as its inner layers and an insulation layer as its outmost layer.

When the semiconductor chip is mounted on the glass substrate 30, the ACF is placed between the terminals 30a of the glass substrate 30 and the bump electrodes BP1 and BP2 of the semiconductor chip CHP. As the semiconductor chip CHP is pressurized by applying heat by a heater or the like, pressure is applied only to areas where the bump electrodes BP1 and BP2 lie. This causes metal particles 33 dispersed in the ACF to contact and overlap each other and be pushed against each other. As a consequence, a conductive path is made in the ACF through metal particles 33. Since metal particles of the ACF to which pressure has not been applied hold their surface insulation layers, insulation between neighboring bump electrodes BP1 and between neighboring bump electrodes BP2 is retained. This offers an advantage that even when the interval between bump electrodes BP1 or BP2 is narrow, the semiconductor chip CHP is mounted on the glass substrate 30 without causing shorting.

In this embodiment 1, in a semiconductor chip, dummy patterns are formed in the top wiring layer and the surface protection film which covers the top wiring layer is flattened by CMP. Therefore, the flatness of bump electrodes formed over the surface protection film is increased. This ensures that the bump electrodes contact metal particles in an anisotropic conductive film properly throughout the bump electrodes. This improves the reliability in coupling between the bump electrodes of the semiconductor chip and terminals (wirings) of the mounting substrate.

Figure 35:
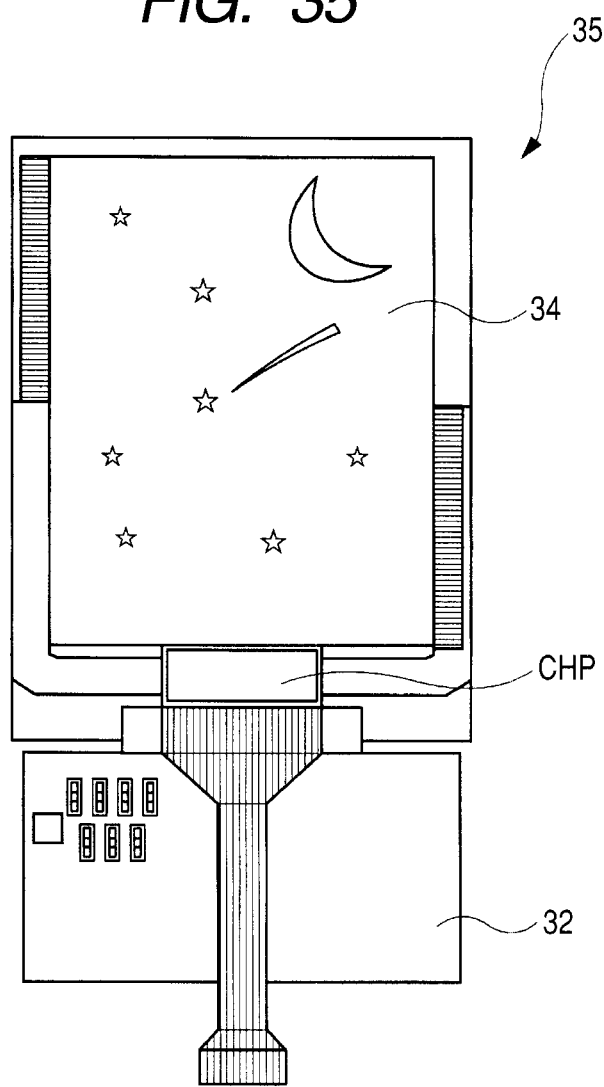
FIG. 35 shows main components of a liquid crystal display device.
Figure 36:
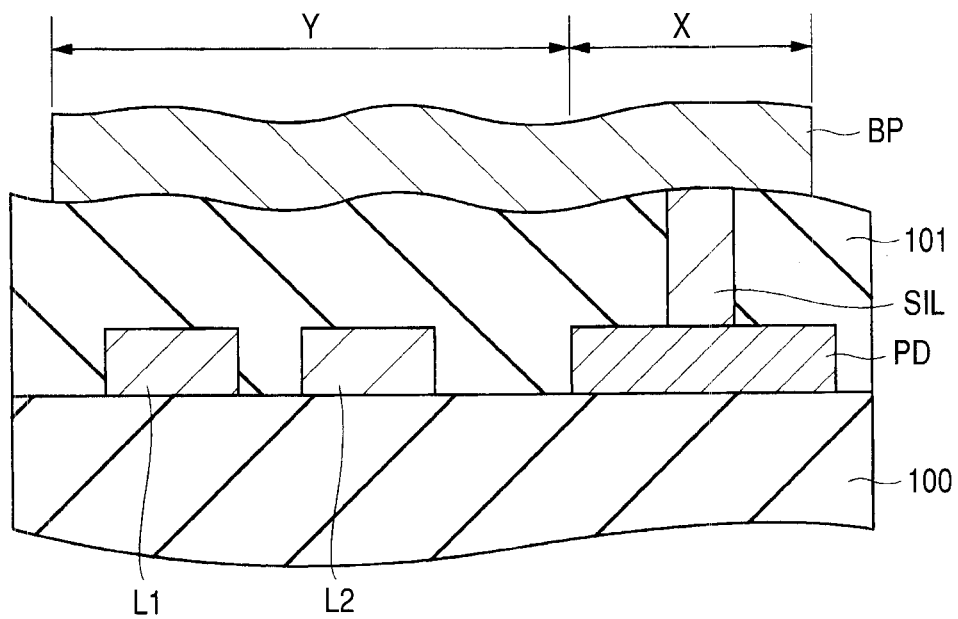
FIG. 36 shows the coupling relation between top layer wirings and a bump electrode of a semiconductor chip, based on the present inventors' examination.
Figure 37:
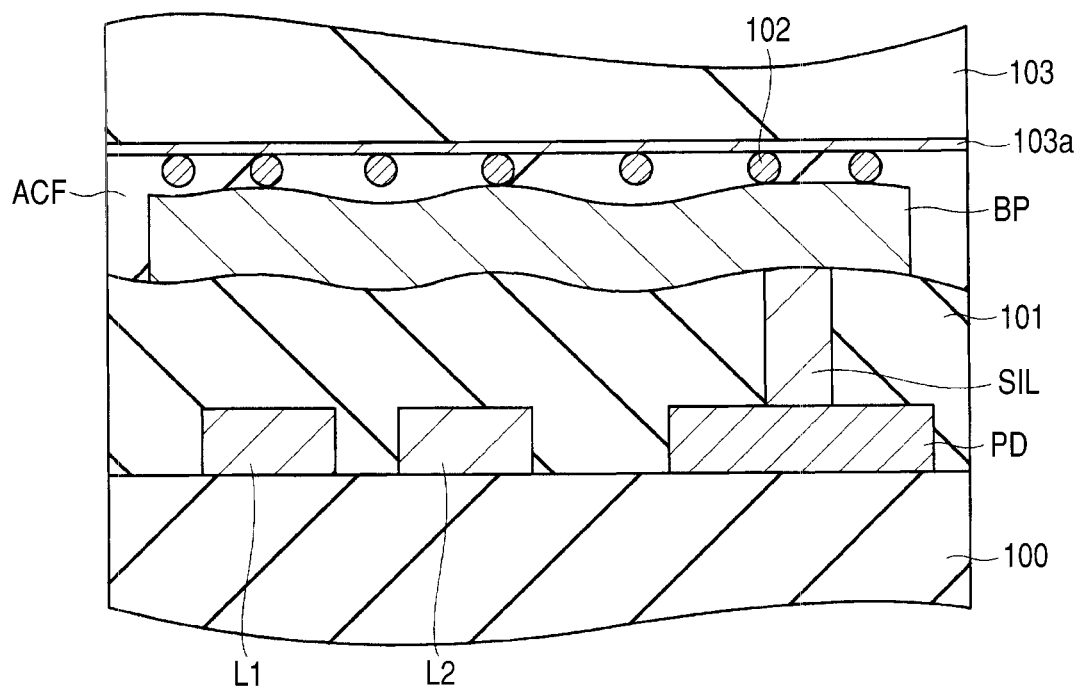
FIG. 37 is a sectional view showing how a semiconductor chip is mounted on a glass substrate, based on the present inventors' examination.

FIG. 35 shows the general structure of an LCD (liquid crystal display device 35). As illustrated in FIG. 35, an LCD screen 34 is formed on a glass substrate where images appear on this screen 34. A semiconductor chip CHP as an LCD driver is mounted on the glass substrate near the screen 34. A flexible printed circuit board 32 is mounted near the semiconductor chip CHP and the semiconductor chip as a driver is placed between the flexible printed circuit board 32 and LCD screen 34. The semiconductor chip CHP is thus mounted on the glass substrate. The semiconductor chip CHP as an LCD driver is thus mounted on the liquid crystal display device 35.

The invention made by the present inventors has been so far concretely described in reference to preferred embodiments thereof. However, the present invention is not limited to the embodiments and it is obvious that the invention may be modified in various ways without departing from the spirit and scope thereof.

The invention can be widely used in the semiconductor device manufacturing industry.

What is claimed is:

1. A semiconductor device comprising:
   (a) a semiconductor substrate;
   (b) a semiconductor element formed over the semiconductor substrate;
   (c) a first wiring formed over the semiconductor element;
   (d) a first insulating film formed over the semiconductor substrate to cover the semiconductor element and the first wiring;
   (e) a pad formed over the first insulating film;
   (f) a second insulating film having a portion formed over the pad and an opening which reaches the pad; and
   (g) a bump electrode formed over the second insulating film and electrically coupled to the pad by way of the opening,
   wherein in a same layer as the pad, a second wiring and a dummy pattern different from the second wiring are formed,
   wherein respective portions of the second wiring and the dummy pattern are disposed under the bump electrode, and
   wherein a long side of the dummy pattern extends in a direction transverse to a long-side direction of the second wiring in a plan view.

2. The semiconductor device according to claim 1, wherein the long side of the dummy pattern extends in a direction perpendicular to the long-side direction of the second wiring in the plan view.

3. The semiconductor device according to claim 1, wherein the entire plan view area of the dummy pattern is overlapped by the bump electrode in the plan view.

4. The semiconductor device according to claim 1, including a plurality of said dummy patterns.

5. The semiconductor device according to claim 1,
   wherein the semiconductor device is an LCD driver for a liquid crystal display.

6. The semiconductor device according to claim 1, wherein an upper surface of the second insulating film is flat.

7. The semiconductor device according to claim 6,
   wherein the second insulating film comprises a first silicon oxide film formed by plasma CVD, a second silicon oxide film of TEOS formed over the first silicon oxide film, and a silicon nitride film formed over the second silicon oxide film.

8. The semiconductor according to claim 7,
   wherein an upper surface of the second silicon oxide film is flat.

9. A semiconductor device including a rectangular semiconductor chip having long edges and short edges in a plan view, the semiconductor chip comprising:
(a) a rectangular semiconductor substrate having a pair of short edges and a pair of long edges;
(b) a semiconductor element formed over the semiconductor substrate;
(c) a first wiring formed over the semiconductor element;
(d) a first insulating film formed over the semiconductor substrate to cover the semiconductor element and the first wiring;
(e) a plurality of pads formed over the first insulating film;
(f) a second insulating film having respective portions formed over the pads and a plurality of openings which reach corresponding pads; and
(g) a plurality of rectangular bump electrodes which are formed over the second insulating film and electrically coupled to the pads by way of the corresponding openings,
wherein, in a same layer as the pads, a second wiring comprised of a power line or a signal line and first dummy patterns different from the second wiring are formed,
wherein the bump electrodes are arranged in line at least in a long edge direction of the semiconductor chip, with long edges of the bump electrodes being parallel to a short edge direction of the semiconductor chip,
wherein each of the bump electrodes has an overlap region which overlaps a corresponding pad in the plan view and a non-overlap region which does not overlap the corresponding pad in the plan view,
wherein the second wiring extends in the long edge direction of the semiconductor chip and has portions disposed under the non-overlap regions of the bump electrodes,
wherein each of the first dummy patterns is formed, respectively, in an area which does not overlap any of the bump electrodes in the plan view and is between the non-overlap regions of the bump electrodes in the plan view, and
wherein a long side of each of the first dummy patterns extends in a direction transverse to the long edge direction in the plan view.

10. The semiconductor device according to claim 9, wherein the long side of each of the dummy patterns extends in a direction perpendicular to the long edge direction in the plan view.

11. The semiconductor device according to claim 9, including plurality of said dummy patterns.

12. The semiconductor device according to claim 9, wherein the semiconductor device is an LCD driver for a liquid crystal display.

13. The semiconductor device according to claim 9, wherein an upper surface of the second insulating film is flat.

14. The semiconductor device according to claim 13, wherein the second insulating film comprises a first silicon oxide film formed by plasma CVD, a second silicon oxide film of TEOS formed over the first silicon oxide film, and a silicon nitride film formed over the second oxide film.

15. The semiconductor device according to claim 14, wherein an upper surface of the second silicon oxide film is flat.

* * * * *